(12) United States Patent
Ueda

(10) Patent No.: US 9,087,714 B2
(45) Date of Patent: Jul. 21, 2015

(54) SEMICONDUCTOR INTEGRATED CIRCUIT AND SEMICONDUCTOR INTEGRATED CIRCUIT APPARATUS

(75) Inventor: Yuuichi Ueda, Osaka (JP)

(73) Assignee: RICOH ELECTRONIC DEVICES CO., LTD., Osaka (JP)

( * ) Notice: Subject to any disclaimer, the term of this patent is extended or adjusted under 35 U.S.C. 154(b) by 20 days.

(21) Appl. No.: 13/223,356

(22) Filed: Sep. 1, 2011

(65) Prior Publication Data

US 2012/0049292 A1     Mar. 1, 2012

(30) Foreign Application Priority Data

Sep. 1, 2010   (JP) ................................. 2010-195889

(51) Int. Cl.
*H01L 27/088*     (2006.01)
*H01L 21/8234*   (2006.01)

(52) U.S. Cl.
CPC ...... *H01L 27/088* (2013.01); *H01L 21/823418* (2013.01); *H01L 21/823425* (2013.01)

(58) Field of Classification Search
CPC .................. H01L 2924/0002; H01L 2924/00; H01L 27/088; H01L 27/0921
USPC .................. 438/199; 257/357, 358, 359, 409, 257/E27.06, E29.12
See application file for complete search history.

(56) References Cited

U.S. PATENT DOCUMENTS 5,124,778 A * 6/1992 Adachi ........................ 257/369
5,159,516 A   10/1992 Fujihira
5,321,293 A * 6/1994 Mojaradi et al. .............. 257/369
5,726,505 A   3/1998 Yamada et al.
5,892,647 A   4/1999 Mizoe (Continued)

FOREIGN PATENT DOCUMENTS

JP     58-144234      8/1983
JP     1-276920      11/1989

(Continued)

OTHER PUBLICATIONS

Ker, Ming-Dou, et al. (2006), "Design of Charge Pump Circuit With Consideration of Gate-Oxide Reliability in Low-Voltage CMOS Processes," IEEE Journal of Solid-State Circuits, vol. 41, No. 5, pp. 1100-1107.

(Continued)

*Primary Examiner* — Bradley K Smith
*Assistant Examiner* — David Goodwin
(74) *Attorney, Agent, or Firm* — Cooper & Dunham LLP

(57) ABSTRACT

A semiconductor integrated circuit includes a substrate of a first conductivity type, and a first MOS transistor and a second MOS transistor both formed in the substrate. The first MOS transistor includes first drain and first source regions as first active regions of a second conductivity type; a second active region of the first conductivity type; a first gate electrode disposed between the first drain and source regions; and a first substrate electrode connected to the second active region. The second MOS transistor includes a second drain region and a second source region which are formed between the first source region and the second active region, such that the first source region is proximate to the second drain region. The first substrate electrode is electrically separated from the first drain and source electrodes, and the second MOS transistor is connected between the first substrate electrode and the first source electrode.

5 Claims, 35 Drawing Sheets

(56) References Cited

U.S. PATENT DOCUMENTS

| | | |
|---|---|---|
| 5,903,422 A | 5/1999 | Hosokawa |
| 5,963,055 A | 10/1999 | Tanaka et al. |
| 5,999,041 A | 12/1999 | Nagata et al. |
| 6,011,413 A | 1/2000 | Hayakawa et al. |
| 6,392,392 B1 | 5/2002 | Nakahara |
| 6,396,249 B1 | 5/2002 | Itakura et al. |
| 6,469,568 B2 | 10/2002 | Toyoyama et al. |
| 6,501,248 B2 | 12/2002 | Fujiwara |
| 6,535,052 B2 | 3/2003 | Myono |
| 6,853,566 B2 | 2/2005 | Itoh |
| 7,123,076 B2 | 10/2006 | Hatakeyama et al. |
| 7,548,403 B2 | 6/2009 | Nagata et al. |
| 7,582,938 B2 * | 9/2009 | Chen .................... 257/357 |
| 7,626,792 B2 | 12/2009 | Mitsuda |
| 7,660,091 B2 | 2/2010 | Nakajima |
| 7,679,429 B2 | 3/2010 | Nakamura |
| 8,350,329 B2 * | 1/2013 | Campi .................... 257/355 |
| 2004/0036497 A1 | 2/2004 | Nakayama et al. |
| 2004/0051146 A1 * | 3/2004 | Ker et al. .............. 257/356 |
| 2005/0017306 A1 * | 1/2005 | Morishita ............. 257/355 |
| 2007/0139839 A1 | 6/2007 | Yoshihara |
| 2007/0229041 A1 | 10/2007 | Oki et al. |
| 2008/0030261 A1 | 2/2008 | Nakata |
| 2009/0050978 A1 | 2/2009 | Ueda |

FOREIGN PATENT DOCUMENTS

| | | |
|---|---|---|
| JP | 4-223508 | 8/1992 |
| JP | 5-26912 | 2/1993 |
| JP | 7-54336 | 6/1995 |
| JP | 7-321293 | 12/1995 |
| JP | 9-503109 | 3/1997 |
| JP | 10-14099 | 1/1998 |
| JP | 10-229165 | 8/1998 |
| JP | 10-240359 | 9/1998 |
| JP | 10-335998 | 12/1998 |
| JP | 11-186503 | 7/1999 |
| JP | 2000-201429 | 7/2000 |
| JP | 3101998 | 8/2000 |
| JP | 2001-186007 | 7/2001 |
| JP | 3210567 | 7/2001 |
| JP | 2002-505496 | 2/2002 |
| JP | 2002-84739 | 3/2002 |
| JP | 2002-152968 | 5/2002 |
| JP | 2002-152978 | 5/2002 |
| JP | 2002-176730 | 6/2002 |
| JP | 3329168 | 7/2002 |
| JP | 3385995 | 1/2003 |
| JP | 2003-88102 | 3/2003 |
| JP | 2003-258614 | 9/2003 |
| JP | 2003-333831 | 11/2003 |
| JP | 2004-6868 | 1/2004 |
| JP | 3606994 | 10/2004 |
| JP | 3637848 | 1/2005 |
| JP | 2005-31032 | 2/2005 |
| JP | 3644156 | 2/2005 |
| JP | 2005-65178 | 3/2005 |
| JP | 2005-151677 | 6/2005 |
| JP | 2005-237028 | 9/2005 |
| JP | 2005-333691 | 12/2005 |
| JP | 2005-339658 | 12/2005 |
| JP | 2006-48394 | 2/2006 |
| JP | 2006-136134 | 5/2006 |
| JP | 2007-166444 | 6/2007 |
| JP | 2007-195006 | 8/2007 |
| JP | 2007-195007 | 8/2007 |
| JP | 2007-201116 | 8/2007 |
| JP | 2007-273784 | 10/2007 |
| JP | 4068022 | 1/2008 |
| JP | 4190853 | 9/2008 |
| JP | 2008-236528 | 10/2008 |
| WO | WO 95/08868 | 3/1995 |
| WO | WO 99/44203 | 9/1999 |

OTHER PUBLICATIONS

Japanese official action dated Apr. 8, 2014 in corresponding Japanese patent application No. 2010-195889.

* cited by examiner

SEMICONDUCTOR INTEGRATED CIRCUIT AND SEMICONDUCTOR INTEGRATED CIRCUIT APPARATUS

BACKGROUND OF THE INVENTION

1. Field of the Invention

The present invention relates to semiconductor integrated circuits and semiconductor integrated circuit apparatuses including a MOSFET (Metal Oxide Semiconductor Field Effect Transistor; which may be hereafter referred to as a "MOS transistor") having a large-area.

2. Description of the Related Art

FIG. 29 is a plan view of a structure of a N-channel MOSFET (hereafter referred to as a "NMOS transistor") having a large-area according to the related art. FIG. 30 is a plan view of a structure of another large-area NMOS transistor according to the related art. FIGS. 29 and 30 are hatched for ease of understanding. The other plan views described below may be also hatched for similar purposes. As illustrated in FIGS. 29 and 30, the large-area NMOS transistors according to the related art include a p-type semiconductor substrate 100 providing a substrate of a conductivity type. Gate electrodes TG11, which may include polysilicon electrodes, are formed on the p-type semiconductor substrate 100. The gate electrodes TG11 are mutually connected by a metal wire W102 via contact electrodes CE. Drain regions D11 and source regions S11 are also formed on the p-type semiconductor substrate 100. The drain regions D11 and source regions S11 include a plurality of n-type active regions AC11 between which the gate electrodes TG11 are disposed. The drain regions D11 and source regions S11 are alternately disposed laterally in FIGS. 29 and 30. A plurality of drain electrodes TD11 are connected to the drain regions D11. The drain electrodes TD11 are mutually connected by a metal wire W104 via through-holes TH. A plurality of source electrodes TS11 are connected to the source regions S11 and are mutually connected by a metal wire W103. The drain regions D11 and the source regions S11 are surrounded by p-type active regions B11 formed on the p-type semiconductor substrate 100. A plurality of substrate electrodes TB11 are connected to the p-type active regions B11. The substrate electrodes TB11 are connected by a metal wire W101. A silicon oxide film 110 is formed between the p-type semiconductor substrate 100, the drain regions D11, the source regions S11, the p-type active regions B11, the gate electrodes TG11, and the metal wires W101 through W104. In the following, the NMOS transistors illustrated in FIGS. 29 and 30 are referred to as a NMOS transistor MN11.

FIG. 31 is a cross section of a structure of the NMOS transistor MN11 according to the related art. The NMOS transistor illustrated in FIG. 31 includes the drain region D11 and the source region S11, which are n-type active regions formed in a p-type well region or the p-type semiconductor substrate 100; the p-type active region B11; a gate oxide film 106 formed on the p-type semiconductor substrate 100; the gate G11 formed on the gate oxide film 106; the drain electrode TD11 connected to the drain region D11; the source electrode TS11 connected to the source region S11; the substrate electrode TB11 connected to the p-type active region B11; and the gate electrode TG11 connected to the gate G11. Between the gate electrode TG11 and the source electrode TS11, a gate-source voltage Vgs is applied. Between the drain electrode TD11 and the source electrode TS11, a drain-source voltage Vds is applied. Between the source region S11 and drain region D11 and the p-type semiconductor substrate 100, a depletion layer region 102 is formed. By applying a gate-source voltage Vgs higher than the potential of the source region S11 by a threshold voltage Vth to the gate electrode TG11, an n-type channel region 101 is formed in a region immediately below the gate G11, whereby the drain region D11 and the source region S11 are electrically connected.

FIG. 32 is a cross section of the NMOS transistor MN11 according to the related art, illustrating impact ionization in the NMOS transistor MN11. As illustrated in FIG. 32, as the drain-source voltage Vds, which is the potential difference between the drain region D11 and the source region S11, is increased, a large electric field is produced between the drain region D11 and the source region S11. As a result, sufficiently accelerated electrons 103 collide with the silicon lattice near the drain region D11, leading to the generation of electron hole pairs 104 in a phenomenon called "impact ionization". The electrons of the generated electron hole pairs 104 flow via the drain region D11 to the power supply connected to the drain electrode TD11, thus forming part of a drain current. On the other hand, holes 105 of the generated electron hole pairs 104 flow via the depletion layer region 102 to the p-type active region B11, forming a substrate current Isub. The amount of the substrate current Isub depends on the drain-source voltage Vds and the gate-source voltage Vgs of the NMOS transistor MN11.

FIGS. 33 and 34 are graphs illustrating the substrate current Isub with respect to the gate-source voltage Vgs and the drain-source voltage Vds in the NMOS transistor MN11 according to the related art. As illustrated in FIG. 33, the substrate current Isub is increased as the drain-source voltage Vds becomes higher. Further, as illustrated in FIG. 34, the substrate current Isub is greatly increased when the gate-source voltage Vgs is at an intermediate potential such as one half the drain-source voltage Vds.

In order to prevent the generation of the substrate current Isub, it may be effective to reduce the electric field between the drain region D11 and the source region S11 by increasing the gate length of the NMOS transistor, for example. However, this may lead to a decrease in current drive performance of the NMOS transistor.

FIG. 35 is a cross section of a structure of the NMOS transistor MN11 according to the related art, illustrating a circuit diagram of a parasitic bipolar transistor 202 in the NMOS transistor. With reference to FIG. 35, the influence of the flow of the substrate current Isub in the NMOS transistor is described. As illustrated in FIG. 35, the substrate current Isub is observed as a current produced by a current source 201 that flows from the drain electrode TD11 to the substrate electrode TB11. In FIG. 35, a resistance R1 indicates a parasitic resistance of the p-type well region or the p-type semiconductor substrate 100 between the drain electrode TD11 and the substrate electrode TB11. A resistance R2 indicates a parasitic resistance between the substrate electrode TB11 and ground.

When the substrate current Isub is produced, the potential of the p-type well region or the p-type semiconductor substrate 100 is increased by the product of a sum of the resistances R1 and R2 in the path of flow of the substrate current Isub and the substrate current Isub. The npn-type parasitic bipolar transistor 202 includes a collector formed by the drain region D11, which is a n-type active region, a base formed by the p-type active region B11, and a emitter formed by the source region S11, which is an n-type active region. Upon application of a positive base-emitter voltage $V_{BE}$, the parasitic bipolar transistor 202 conducts when the base-emitter voltage $V_{BE}$ exceeds a threshold voltage.

When the parasitic bipolar transistor 202 conducts, a collector current flows through the parasitic bipolar transistor 202, thereby inducing an increase in the base current and impact ionization. Thus, the drain current of the NMOS transistor and the collector current of the parasitic bipolar transistor 202 are increased at an accelerated rate, resulting in electrical and thermal destruction of the NMOS transistor.

The above phenomenon may also occur in a P channel MOSFET (hereafter referred to as a "PMOS transistor") having drain regions and source regions which are p-type active regions formed in a n-type well region or a n-type semiconductor substrate, where the relationship of the electrons and holes, the potential relationship, and the polarities of current are reversed from those described above.

FIG. 36 illustrates a cross section and a circuit diagram of an NMOS transistor according to the related art. In the related art illustrated in FIG. 36, the p-type active region B11 is electrically connected to the source region S11, where the operation of the parasitic bipolar transistor 202 is prevented by decreasing the resistances R1 and R2 in the path of flow of the substrate current Isub by various techniques. The techniques may include a "batting source" layout as described in Patent Document 1 by which the source region and the p-type active region are integrally laid out. A method may also be employed by which the p-type active region is connected to the source region by using a low-resistance wire.

However, the NMOS transistor may be used in an application in which a reversal of the potentials of the drain electrode TD11 and the source electrode TS11 may occur such that the potential of the source electrode TS11 may become higher than the potential of the drain electrode TD11. The potential reversal may be caused by a charge/discharge control for a secondary battery or a reverse-flow preventing function. In such an application, a p-n junction 203 between the p-type active region B11 and the drain region D11 illustrated in FIG. 37 is forward-biased when the potential of the source electrode TS11 exceeds the potential of the drain electrode TD11. As a result, an inverse-flow current Irev flows through the p-n junction 203.

In order to prevent the inverse-flow current Irev, the potential of the substrate electrode TB11 may be independently set at a minimum potential at all times. However, in this case, when a positive potential difference develops between the source electrode TS11 and the substrate electrode TB11, the threshold voltage Vth of the NMOS transistor is increased due to a substrate bias effect, resulting in a decrease in the current drive performance of the NMOS transistor.

Thus, in order to prevent the inverse-flow current Irev without lowering the current drive performance of the NMOS transistor, the substrate electrode TB11 and the source electrode TS11 may be electrically connected to or disconnected from each other by a separate NMOS transistor as needed.

FIGS. 38 and 39 each illustrate a cross section and circuit diagram of an NMOS transistor structure according to the related art in which a second NMOS transistor MN12 is provided between the source electrode TS11 and the substrate electrode TB11. A similar circuit is also discussed in Patent Document 2. As illustrated in FIGS. 38 and 39, during a normal operation, a high-level potential is applied to the gate electrode TG12 of the second NMOS transistor MN12 so as to conduct the second NMOS transistor MN12. When the potentials of the source electrode TS11 and the drain electrode TD11 are reversed, the second NMOS transistor MN12 is turned off so as to set the potential of the substrate electrode TB11 at a minimum potential, thus preventing the inverse-flow current Irev.

However, as a result of the provision of the second NMOS transistor MN12 between the substrate electrode TB11 and the source electrode TS11, an on-resistance R2m of the second NMOS transistor MN12 and wiring resistances R2d and R2s in the paths to the second NMOS transistor MN12, which is a separating element, are disposed between the substrate electrode TB11 and the source electrode TS11, as illustrated in FIG. 38. Thus, the resistance of the path through which the substrate current Isub may flow tends to increase. As a result, an operation of the parasitic bipolar transistor 202 is induced.

It is therefore a general object of the present invention to overcome the problems of the related art. A more specific object may be to provide a semiconductor integrated circuit and a semiconductor integrated circuit apparatus having a smaller occupied area than that of the related art and capable of reducing the resistance of the path through which a substrate current flows, and capable of preventing the operation of a parasitic bipolar transistor.

Patent Document 1: Japanese Laid-open Patent Publication No. 2007-273784

Patent Document 2: Japanese Laid-open Patent Publication No. 09-503109

SUMMARY OF THE INVENTION

According to one aspect of the present invention, a semiconductor integrated circuit includes a substrate having a first conductivity type, and a first MOS transistor and a second MOS transistor both formed in the substrate. The first MOS transistor includes a first drain region and a first source region as first active regions of a second conductivity type; a second active region of the first conductivity type; a first gate electrode disposed between the first drain region and the first source region; and a first substrate electrode connected to the second active region. The second MOS transistor includes a second drain region and a second source region which are formed between the first drain region and the second active region, such that the first drain region is proximate to the second source region. The first substrate electrode is electrically separated from the first drain electrode and the first source electrode. The second MOS transistor is connected between the first substrate electrode and the first source electrode.

DETAILED DESCRIPTION OF THE PREFERRED EMBODIMENTS

Figure 1:
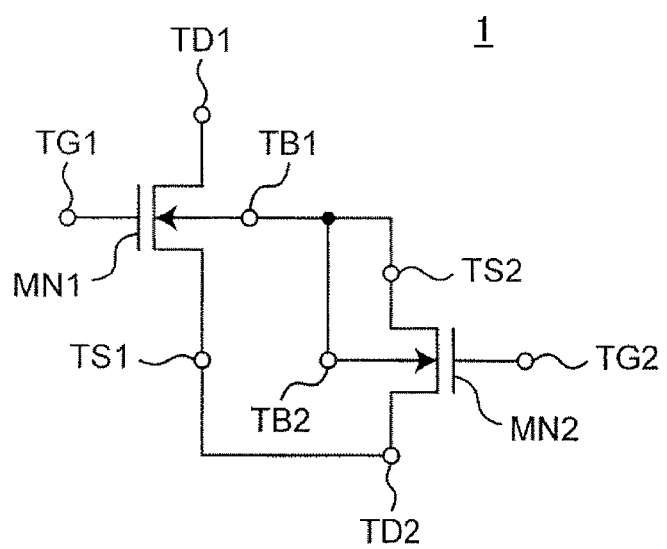
FIG. 1 is a circuit diagram of a semiconductor integrated circuit according to a first embodiment of the present invention.

Embodiments of the present invention are described with reference to the attached drawings wherein like reference numerals designate identical or corresponding parts throughout the several views.

First Embodiment

FIG. 1 is a circuit diagram of a semiconductor integrated circuit 1 according to a first embodiment. The semiconductor integrated circuit 1 includes a first NMOS transistor MN1 and a second NMOS transistor MN2. The first NMOS transistor MN1 includes a source electrode TS1, a gate electrode TG1, a drain electrode TD1, and a substrate electrode TB1. The second NMOS transistor MN2 includes a source electrode TS2, a gate electrode TG2, a drain electrode TD2, and a substrate electrode TB2. The source electrode TS1 is connected to the drain electrode TD2. The source electrode TS2 is connected to the substrate electrodes TB1 and TB2. In the semiconductor integrated circuit 1, the substrate electrode TB1 and the source electrode TS1 may be electrically connected to or disconnected from each other by a control voltage applied to the gate electrode TG2 of the second NMOS transistor MN2.

Figure 2:
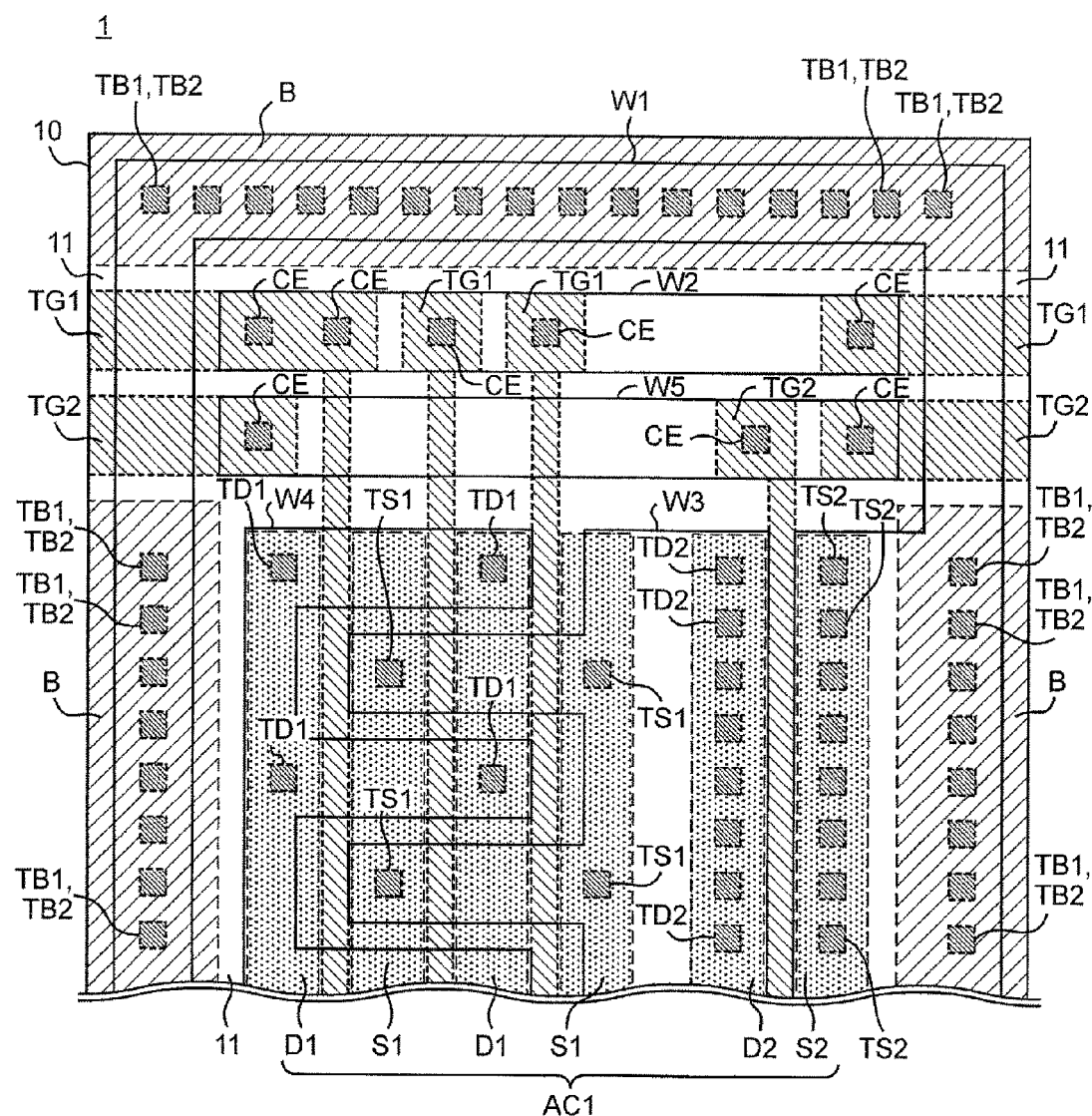
FIG. 2 is a plan view of a structure of the semiconductor integrated circuit illustrated in FIG. 1.

FIG. 2 is a plan view illustrating a structure of the semiconductor integrated circuit 1 according to the first embodiment. In the semiconductor integrated circuit 1, the first NMOS transistor MN1 includes drain regions D1 and source regions S1 formed on the p-type semiconductor substrate 10 as n-type active regions AC1, the drain regions D1 and the source regions S1 being spaced apart from each other; p-type active regions B formed in the p-type semiconductor substrate 10; the gate electrodes TG1 formed between the drain regions D1 and the source regions S1 on the p-type semiconductor substrate 10; the drain electrodes TD1 connected to the drain regions D1; the source electrodes TS1 connected to the source regions S1; and the substrate electrodes TB1 connected to the p-type active regions B.

Also in the semiconductor integrated circuit 1, the second NMOS transistor MN2 includes a drain region D2 and a source region S2 formed between the source region S1 and the p-type active region B in the p-type semiconductor substrate 10 as n-type active regions AC1 such that the source region S1 is proximate to the drain region D2; the p-type active regions B; gate electrodes TG2 formed on the p-type semiconductor substrate 10 between the drain region D2 and the source region S2; drain electrodes TD2 connected to the drain region D2; source electrodes TS2 connected to the source region S2; and substrate electrodes TB2 connected to the p-type active regions B. The substrate electrodes TB1 are electrically separated from the drain electrodes TD1 and the source electrodes TS1. The second NMOS transistor MN2 is connected between the substrate electrodes TB1 and the source electrodes TS1.

In the following, in order to indicate the arrangement of the various structural elements, terms such as "upper side", "lower side", "right side", "left side", "vertical direction", and "lateral direction" are used with respect to the drawings. In FIG. 2, the p-type semiconductor substrate 10 may provide a substrate of a specific conductivity type. The gate electrodes TG1, which may include polysilicon electrodes, are indicated by hatching from upper-left to lower-right (hereinafter referred to as a "first hatching"). The gate electrodes TG2, which may include polysilicon electrodes, are indicated by the first hatching. The drain regions D1 are indicated by hatching of dots (hereinafter referred to as a "second hatching"). The source regions S1 are indicated by the second hatching. The drain region D2 is indicated by the second hatching. The source region S2 is indicated by the second hatching. The p-type active regions B are formed in the upper side, left side, and right side of FIG. 2 and indicated by hatching from upper-right to lower-left (hereinafter referred to as a third hatching). The plural substrate electrodes TB1 and TB2 are connected to the source electrodes TS2 via a metal wire W1. A plurality of contact electrodes CE are connected to the gate electrodes TG1 are also mutually connected via a metal wire W2. The source electrodes TS1 are connected to the drain electrodes TD2 via a metal wire W3. The drain electrodes TD1 are connected via a metal wire W4. A plurality of contact electrodes CE are connected to the gate electrodes TG2 are also mutually connected via a metal wire W5. A silicon oxide film 11 is formed between the p-type semiconductor substrate 10, the drain regions D1 and D2, the source regions S1 and S2, the p-type active regions B, the gate electrodes TG1 and TG2, and the metal wires W1 through W5.

In FIG. 2, the first NMOS transistor MN1 of FIG. 1 is formed by the p-type semiconductor substrate 10, the drain regions D1, the source regions S1, the p-type active regions B, the drain electrodes TD1, the source electrodes TS1, the substrate electrodes TB1, and the gate electrodes TG1. The second NMOS transistor MN2 of FIG. 1 is formed by the p-type semiconductor substrate 10, the drain region D2, the source region S2, the p-type active regions B, the drain electrodes TD2, the source electrodes TS2, the substrate electrodes TB2, and the gate electrodes TG2. As described above, the first NMOS transistor MN1 and the second NMOS transistor MN2 share the P-type semiconductor substrate 10 and the p-type active regions B. The substrate electrodes TB1 and the substrate electrodes TB2 are formed by the same electrodes. The first NMOS transistor MN1 includes an npn-type parasitic bipolar transistor formed by a collector formed by the drain regions D1, a base formed by the p-type active regions B, and an emitter formed by the source regions S1. The wavy lines at the bottom of FIG. 2 indicate that one or more first NMOS transistors MN1 and one or more second NMOS transistors MN2 may be similarly arranged below the wavy lines.

In FIG. 2, the first NMOS transistor MN1 includes the two drain regions D1 and the two source regions S1. The drain regions D1 and the source regions S1 may be electrically connected to or disconnected from each other by the three gate electrodes TG1 formed between the drain regions D1 and the source regions S1. On the other hand, the second NMOS transistor MN2 includes the single drain region D2 and the single source region S2. The drain region D2 and the source region S2 may be electrically connected to or disconnected from each other by the gate electrode TG2 formed between the drain region D2 and the source region S2.

Figure 3:
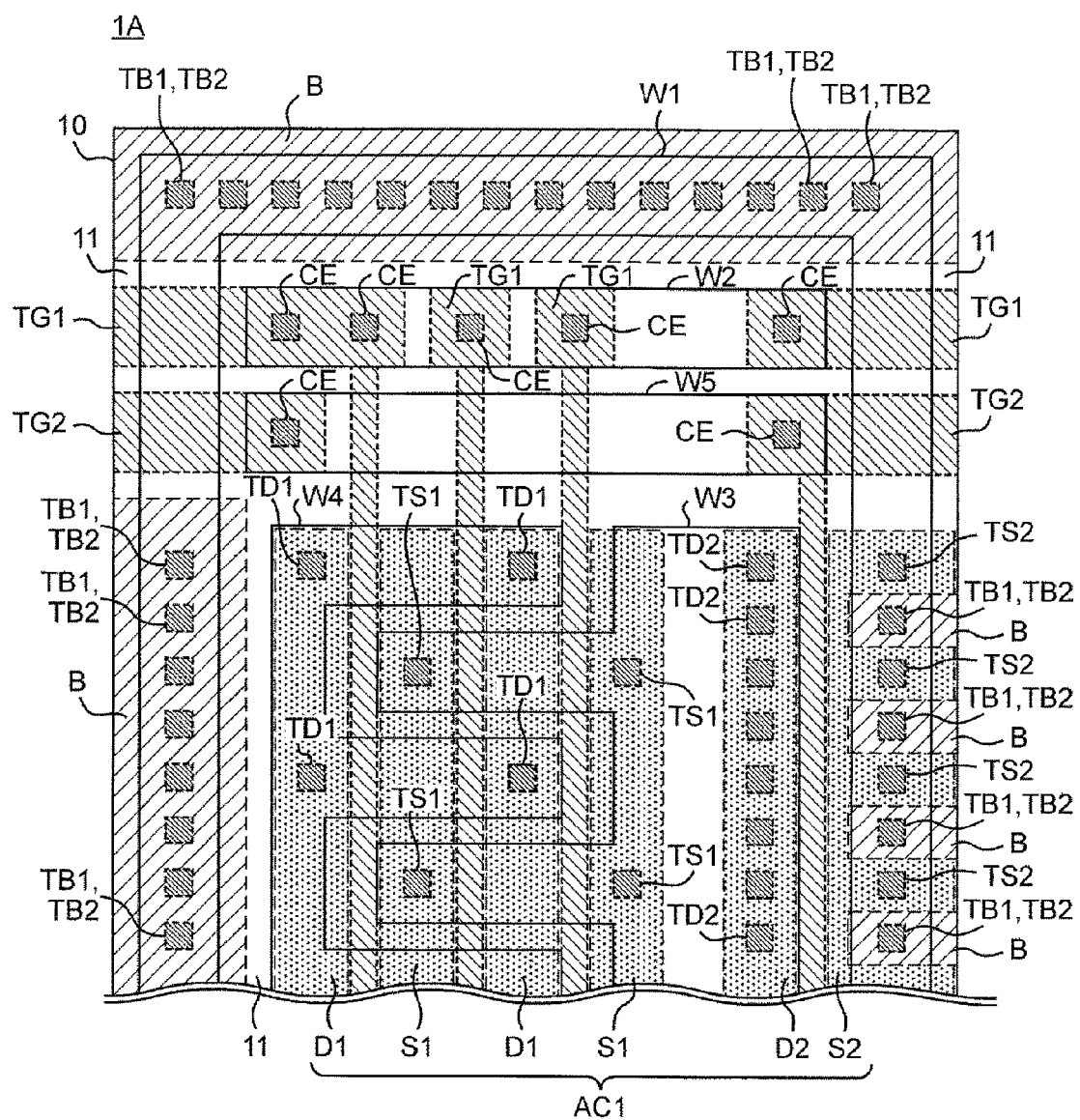
FIG. 3 is a plan view of a structure of a semiconductor integrated circuit according to a variation of the semiconductor integrated circuit of FIG. 2.

FIG. 3 is a plan view of a structure of a semiconductor integrated circuit 1A which is a variation of the semiconductor integrated circuit 1 of FIG. 2. In the semiconductor integrated circuit 1A, compared with the semiconductor integrated circuit 1 illustrated in FIG. 2, the source region S2 is formed adjacent the p-type active region B in a lower-right area of FIG. 3. Other structures and operation may be similar to those of the semiconductor integrated circuit 1. The semiconductor integrated circuit 1A of FIG. 3, compared with the semiconductor integrated circuit 1 of FIG. 2 provides the effect of further reducing the occupied area.

Figure 4:
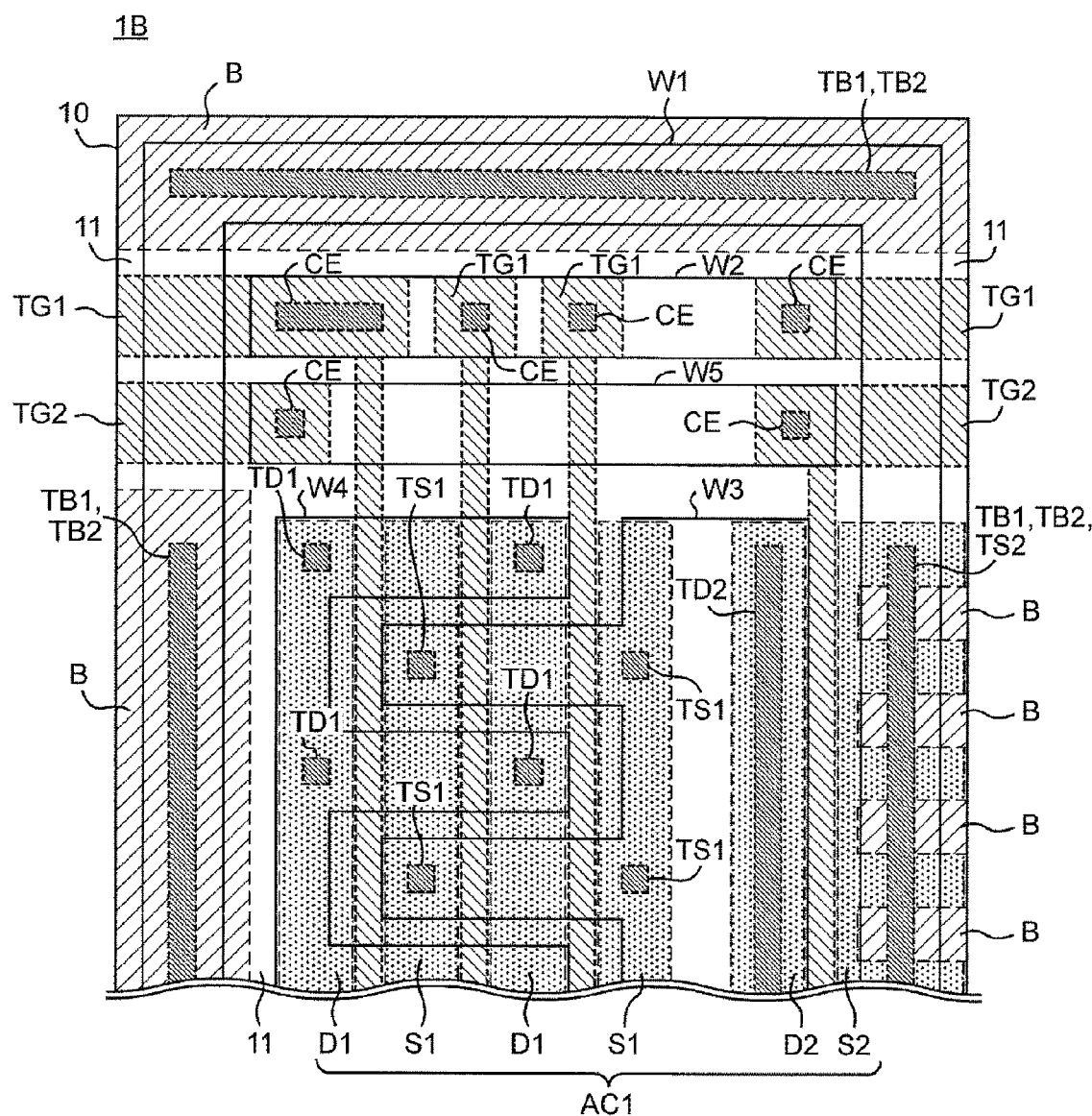
FIG. 4 is a plan view of a semiconductor integrated circuit according to a variation of the semiconductor integrated circuit illustrated in FIG. 3.

FIG. 4 is a plan view of a semiconductor integrated circuit 1B which is a variation of the semiconductor integrated circuit 1A of FIG. 3. In the semiconductor integrated circuit 1B, compared with the semiconductor integrated circuit 1A of FIG. 3, the source electrodes TS2 and the substrate electrodes TB1 and TB2 are formed by the same electrode in a lower-right area of FIG. 4. The p-type active region B formed in the upper side of FIG. 4 includes a single substrate electrode of TB1 and TB2. The p-type active region B formed in the left side of FIG. 4 includes a single substrate electrode TB1 and TB2. The left-most gate electrode TG1 includes a single contact electrode CE. And the drain region D2 includes a single drain electrode TD2. The semiconductor integrated circuit 1B may be similar to the semiconductor integrated circuit 1A in other structures and operation. The structure of the semiconductor integrated circuit 1B may be formed by a process capable of forming a contact electrode extending between a p-type active region and an n-type active region.

In the semiconductor integrated circuits 1, 1A, and 1B illustrated in FIGS. 2 through 4, the source regions S1 of the first NMOS transistor MN1 and the drain region D2 of the second NMOS transistor MN2 are both n-type active regions AC1. Thus, the source regions S1 of the first NMOS transistor MN1 and the drain region D2 of the second NMOS transistor MN2 may be formed in the same region. Such a semiconductor integrated circuit is illustrated in FIGS. 5 through 7.

Figure 5:
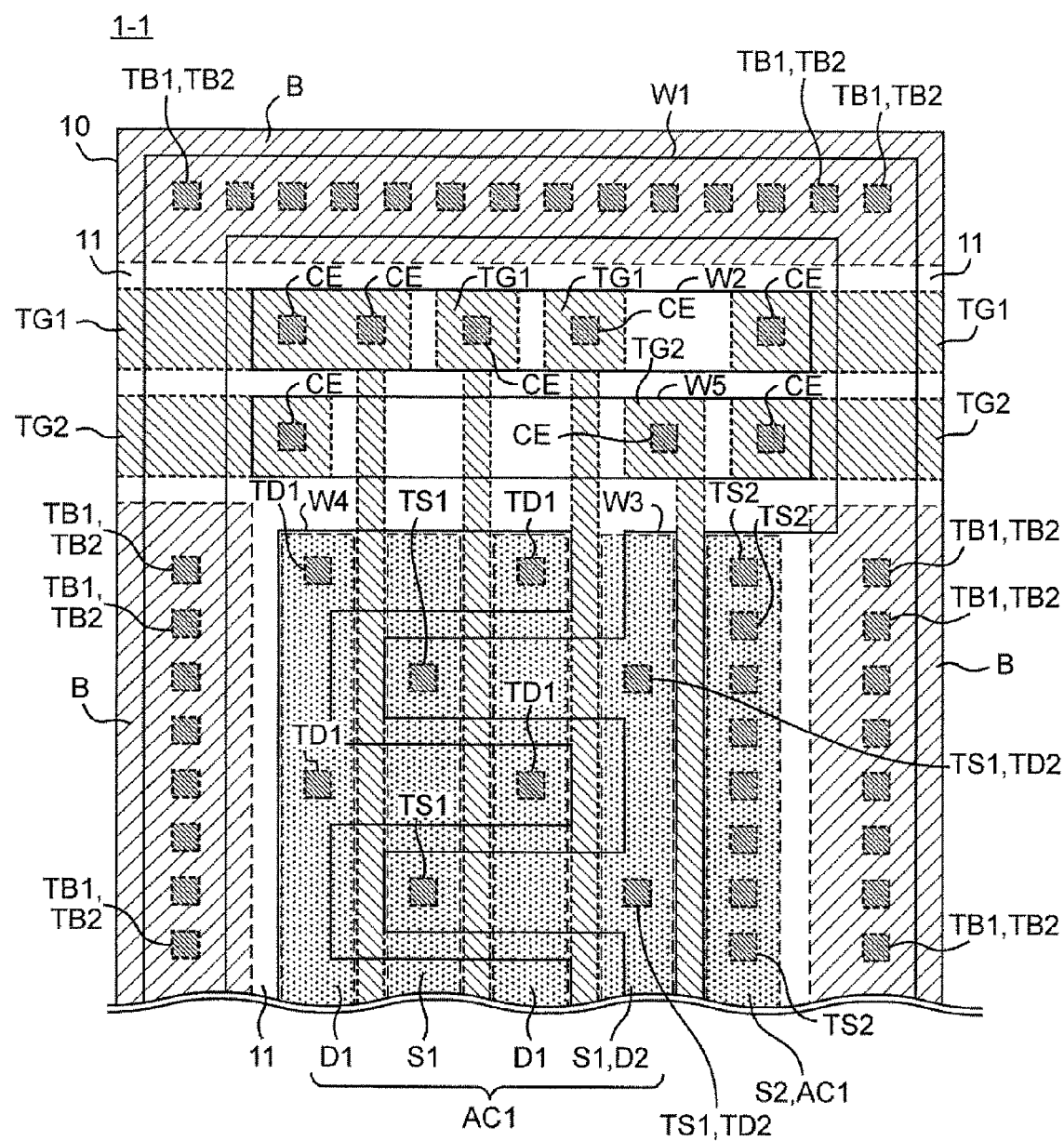
FIG. 5 is a plan view of a structure of a semiconductor integrated circuit according to a variation of the semiconductor integrated circuit illustrated in FIG. 2.

FIG. 5 is a plan view of a semiconductor integrated circuit 1-1 which is a variation of the semiconductor integrated circuit 1 of FIG. 2. In the semiconductor integrated circuit 1-1, compared with the semiconductor integrated circuit 1, the right-most source region S1 and the drain region D2 are formed in the same region. In that same region, the source electrodes TS1 and the drain electrodes TD2 are formed of the same electrodes. The semiconductor integrated circuit 1-1 may be similar to the semiconductor integrated circuit 1 in other structures and operation. The semiconductor integrated circuit 1-1 of FIG. 5, compared with the semiconductor integrated circuit 1 of FIG. 2, provides the effect of further decreasing the occupied area.

Figure 6:
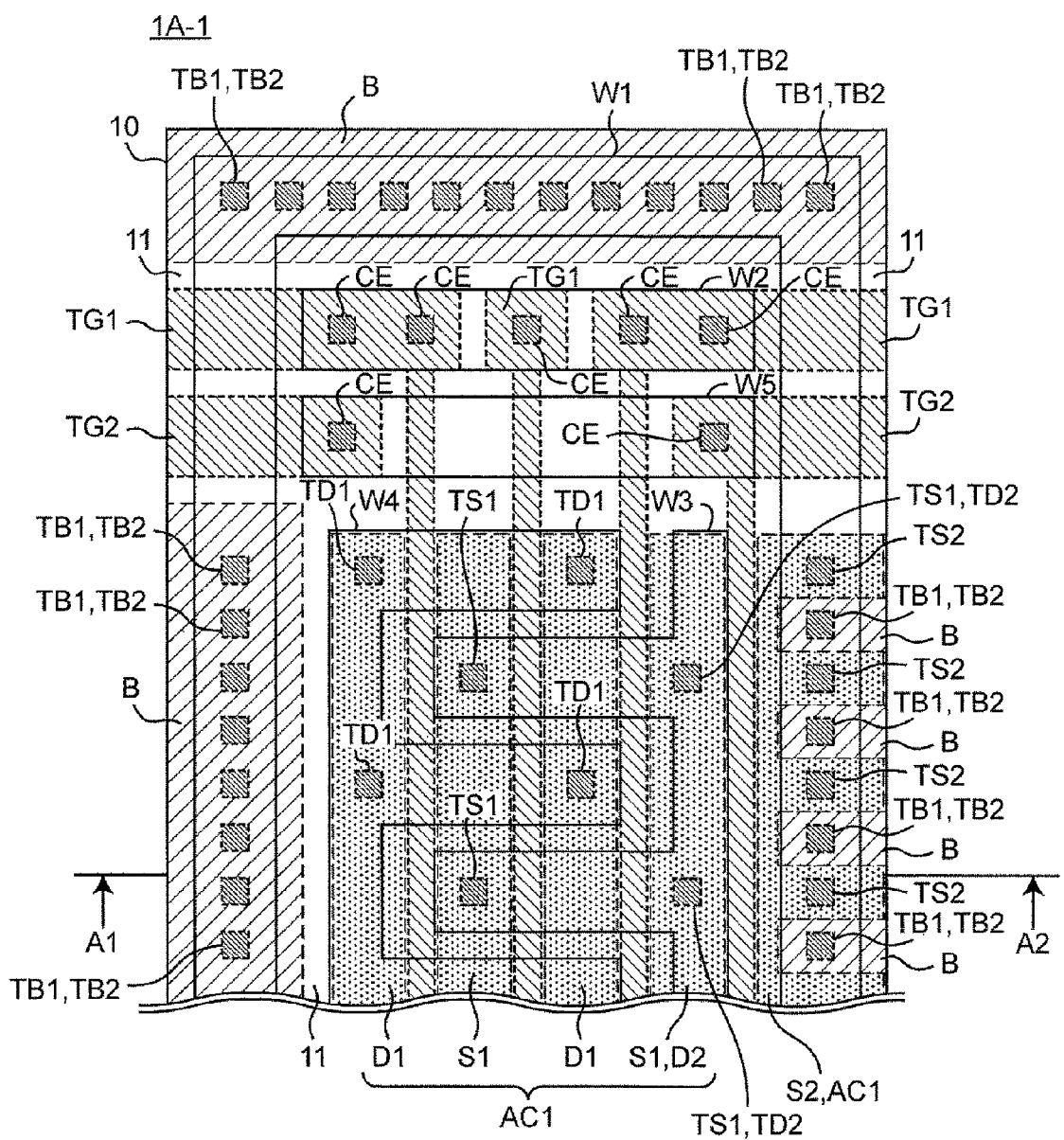
FIG. 6 is a plan view of a structure of a semiconductor integrated circuit according to a variation of the semiconductor integrated circuit illustrated in FIG. 3.

FIG. 6 is a plan view of a semiconductor integrated circuit 1A-1 which is a variation of the semiconductor integrated circuit 1A of FIG. 3. In the semiconductor integrated circuit 1A-1, compared with the semiconductor integrated circuit 1A of FIG. 3, the right-most source region S1 and the drain region D2 are formed in the same region. In that same region, the source electrodes TS1 and the drain electrodes TD2 are formed of the same electrodes. The semiconductor integrated circuit 1A-1 may be similar to the semiconductor integrated circuit 1A in other structures and operation. The semiconductor integrated circuit 1A-1 of FIG. 6, compared with the semiconductor integrated circuit 1A of FIG. 3, provides the effect of further decreasing the occupied area.

Figure 7:
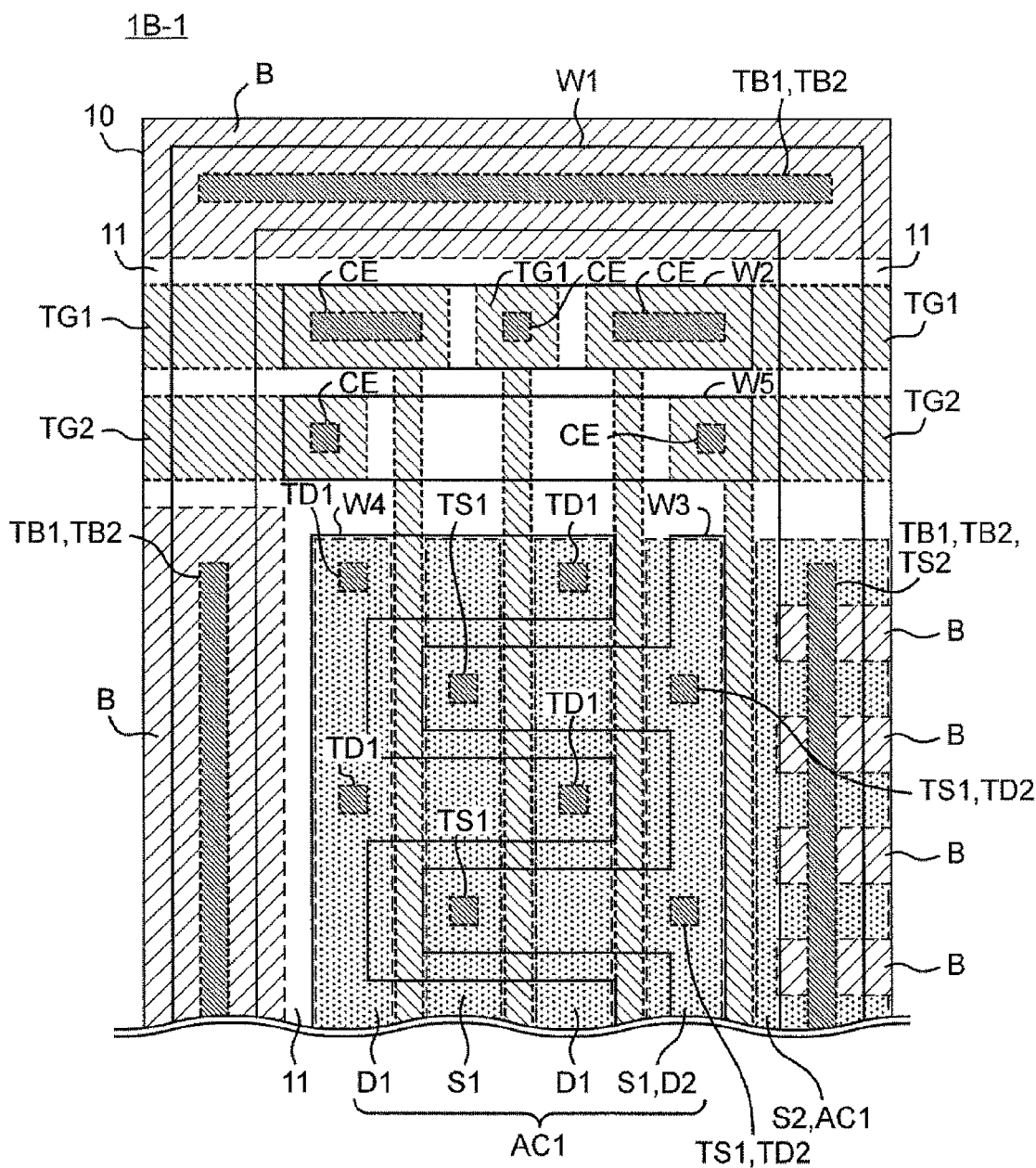
FIG. 7 is a plan view of a structure of a semiconductor integrated circuit according to a variation of the semiconductor integrated circuit illustrated in FIG. 4.

FIG. 7 is a plan view of a semiconductor integrated circuit 1B-1 which is a variation of the semiconductor integrated circuit 1B of FIG. 4. In the semiconductor integrated circuit 1B-1, compared with the semiconductor integrated circuit 1B of FIG. 4, the right-most source region S1 and the drain region D2 are formed in the same region. In that same region, the source electrodes TS1 and the drain electrodes TD2 are formed of the same electrodes. And the right-most gate electrode TG1 includes a single contact electrode CE. The semiconductor integrated circuit 1B-1 may be similar to the semiconductor integrated circuit 1B in other structures and operation. The semiconductor integrated circuit 1B-1 of FIG. 7 provides the effect of further decreasing the occupied area compared with the semiconductor integrated circuit 1B of FIG. 4.

Figure 29:
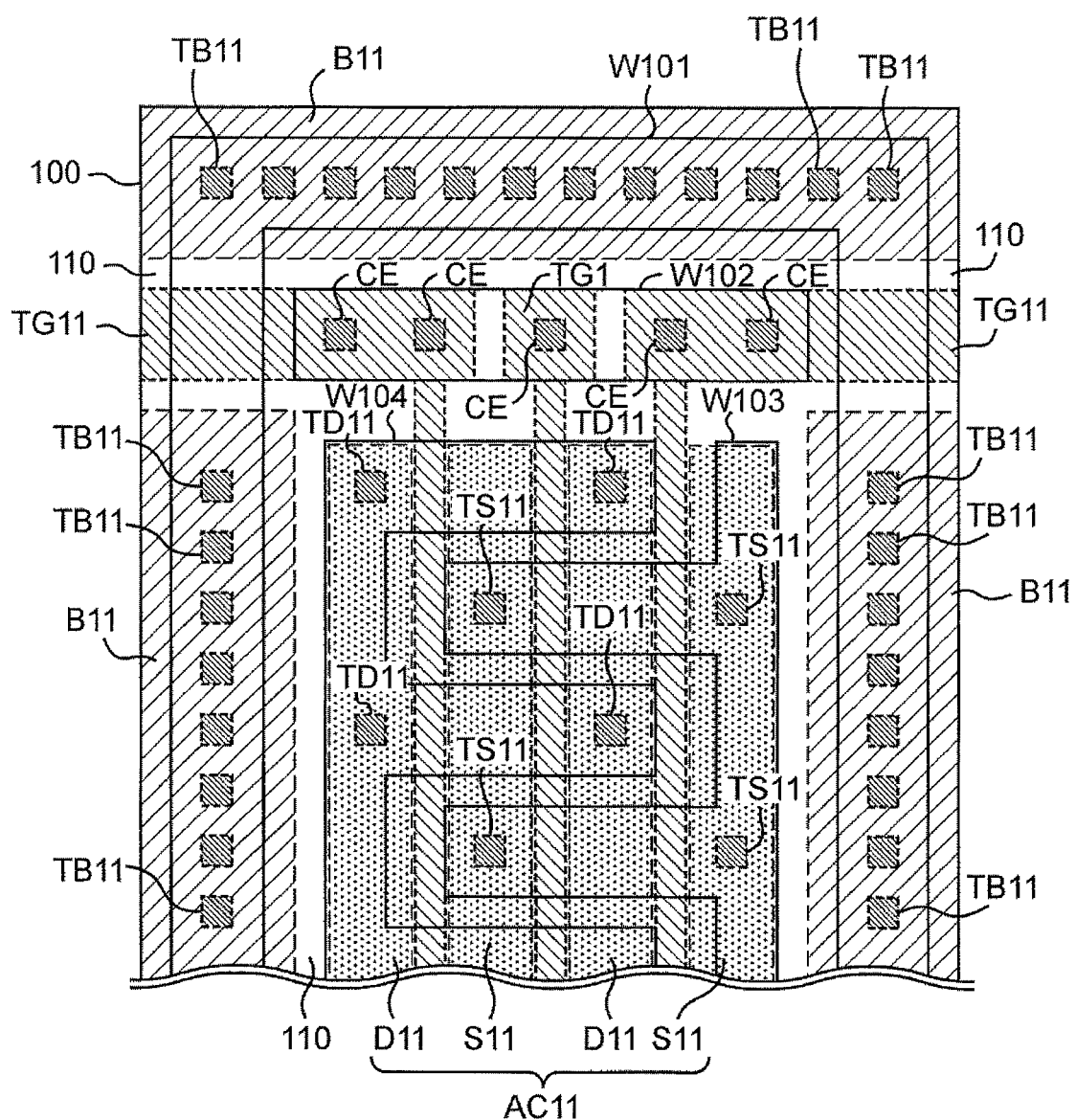
FIG. 29 is a plan view of a structure of a large-area NMOS transistor according to the related art.
Figure 30:
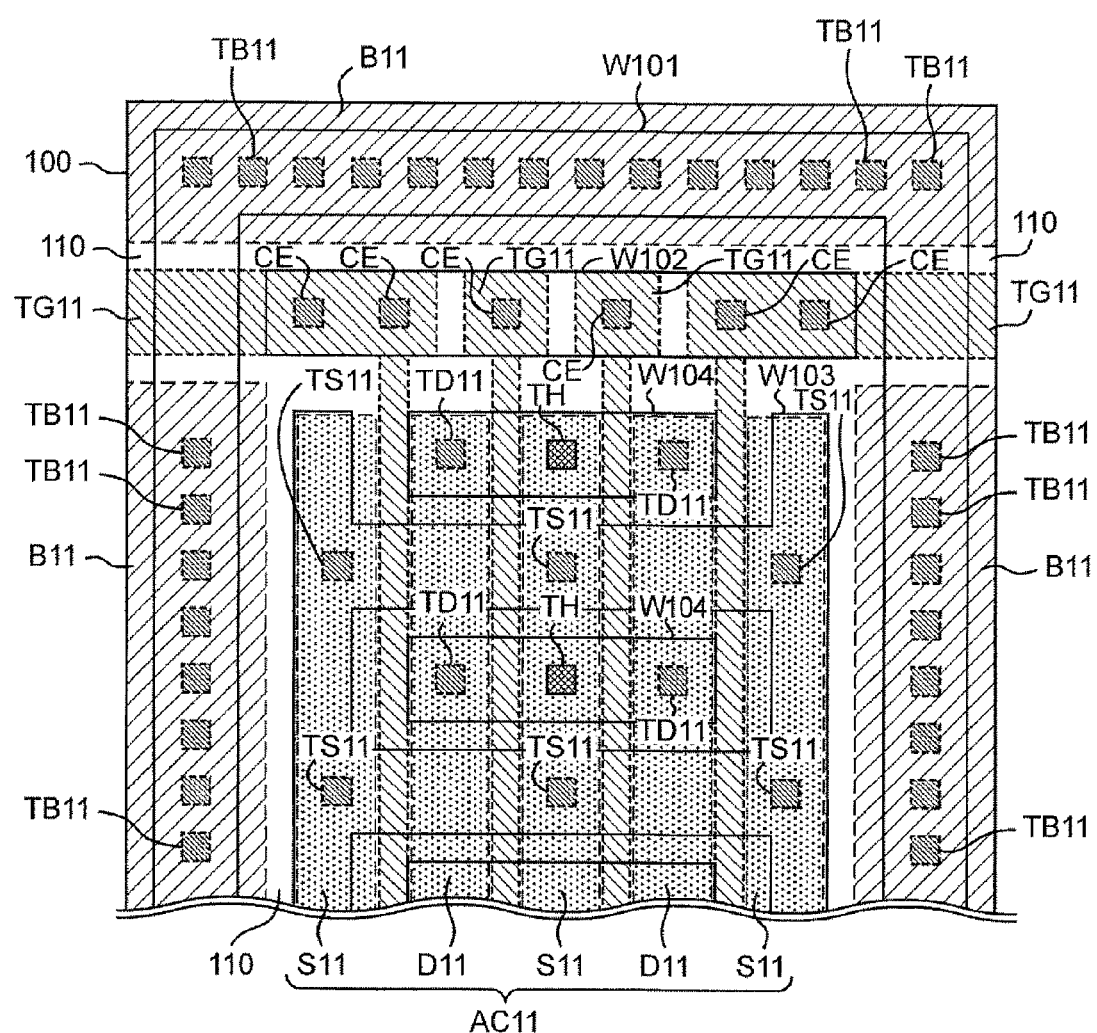
FIG. 30 is a plan view of a structure of another large-area NMOS transistor according to the related art.
Figure 31:
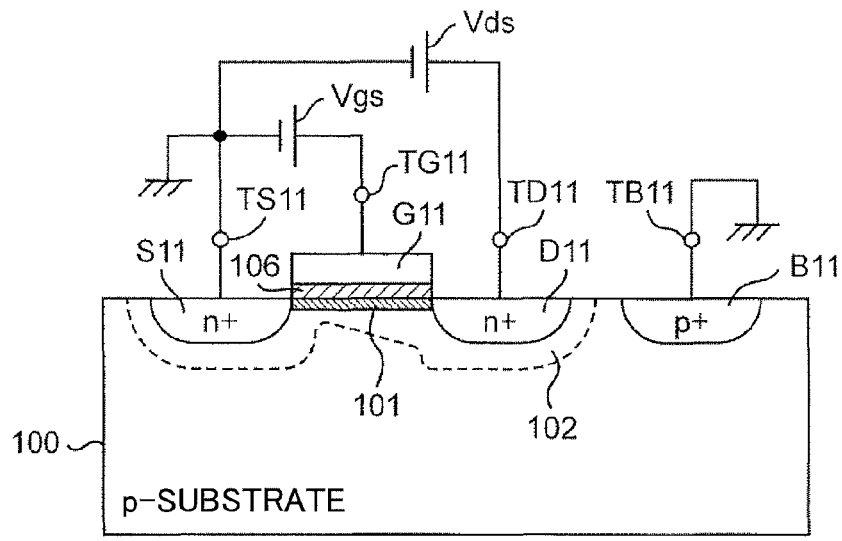
FIG. 31 is a cross section of a structure of a NMOS transistor according to the related art.
Figure 32:
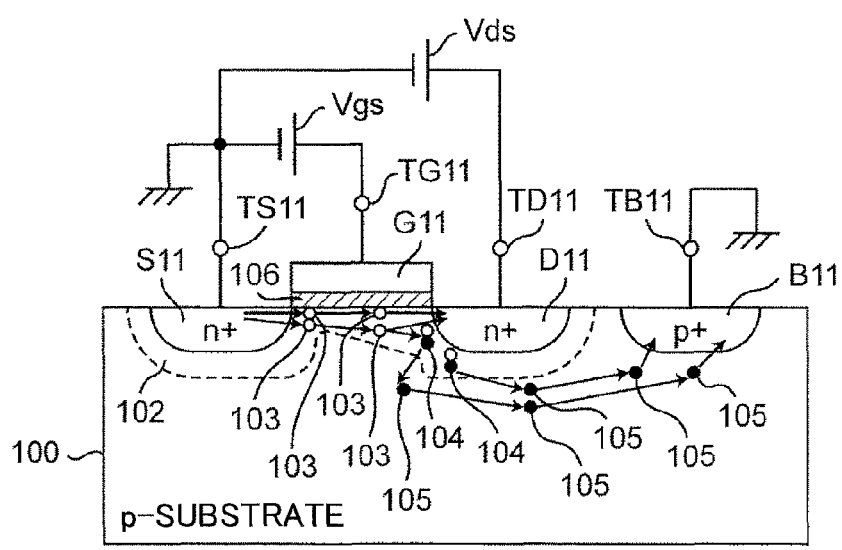
FIG. 32 is a cross section of a structure of the NMOS transistor according to the related art, illustrating the phenomenon of impact ionization in the NMOS transistor.
Figure 33:
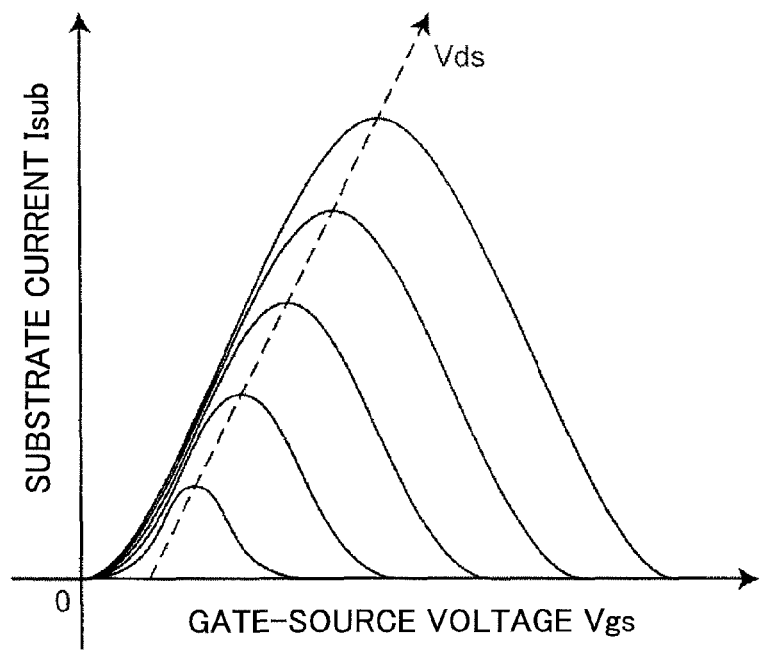
FIG. 33 is a graph plotting a substrate current Isub versus a gate-source voltage Vgs and a drain-source voltage Vds of a MOS transistor according to the related art.
Figure 34:
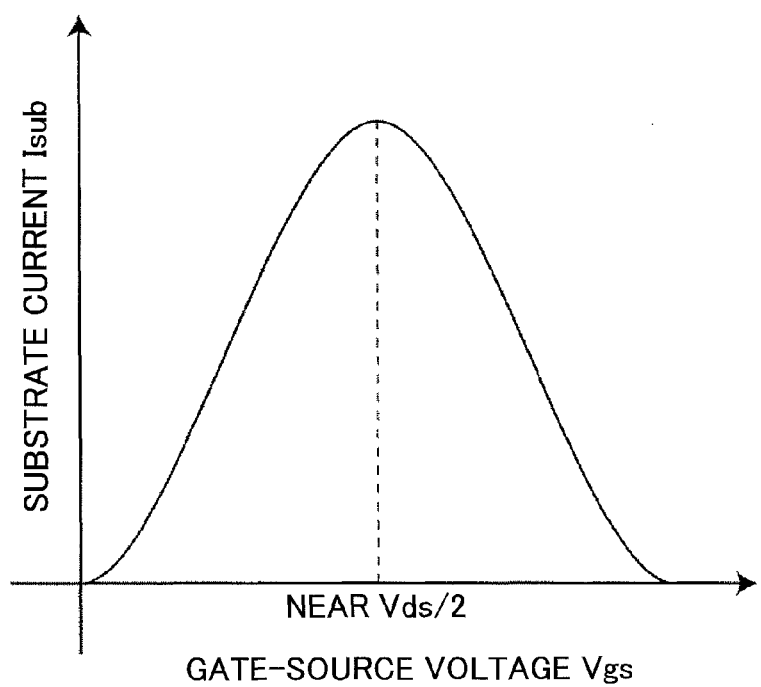
FIG. 34 is a graph plotting the substrate current Isub versus the gate-source voltage Vgs and the drain-source voltage Vds of the MOS transistor according to the related art.
Figure 35:
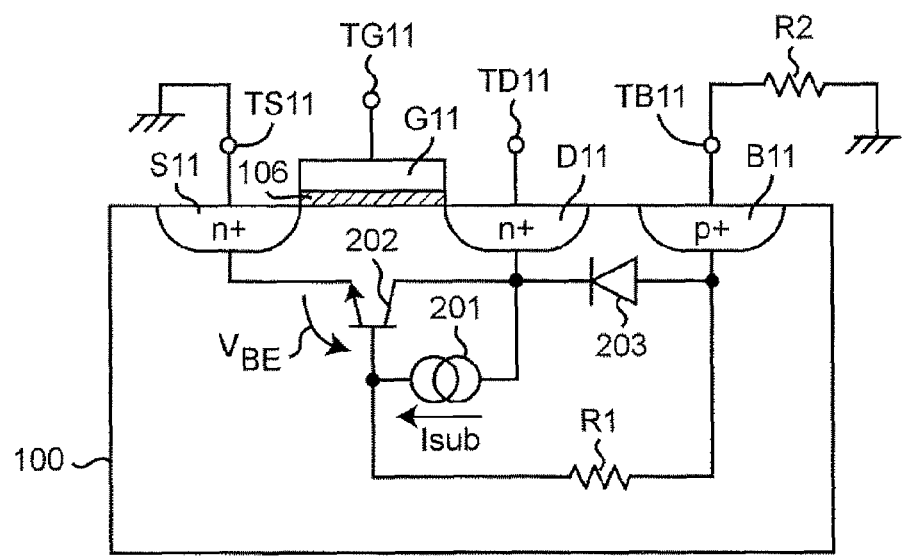
FIG. 35 is a cross section of a structure of a NMOS transistor according to the related art, also illustrating a circuit diagram of a parasitic bipolar transistor of the NMOS transistor.
Figure 36:
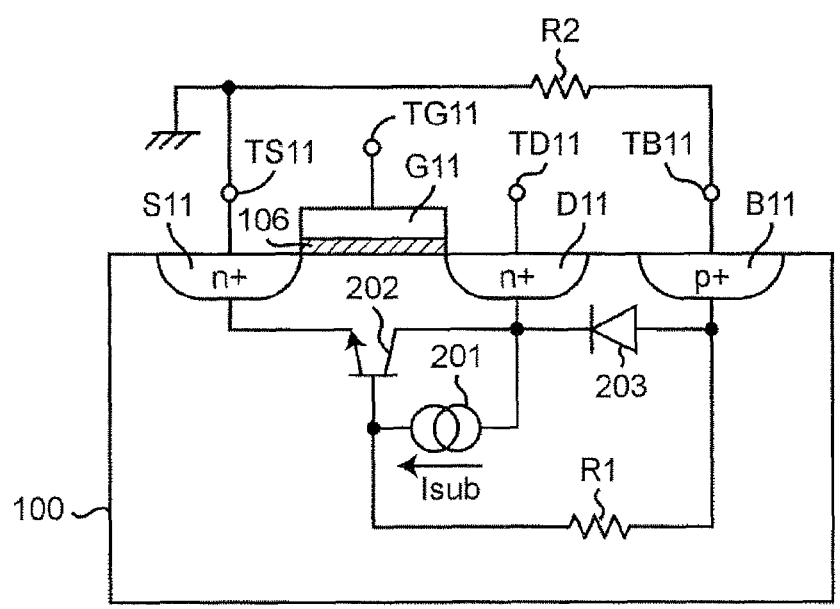
FIG. 36 is a cross section of a structure of a NMOS transistor according to the related art, also illustrating a circuit diagram thereof.
Figure 37:
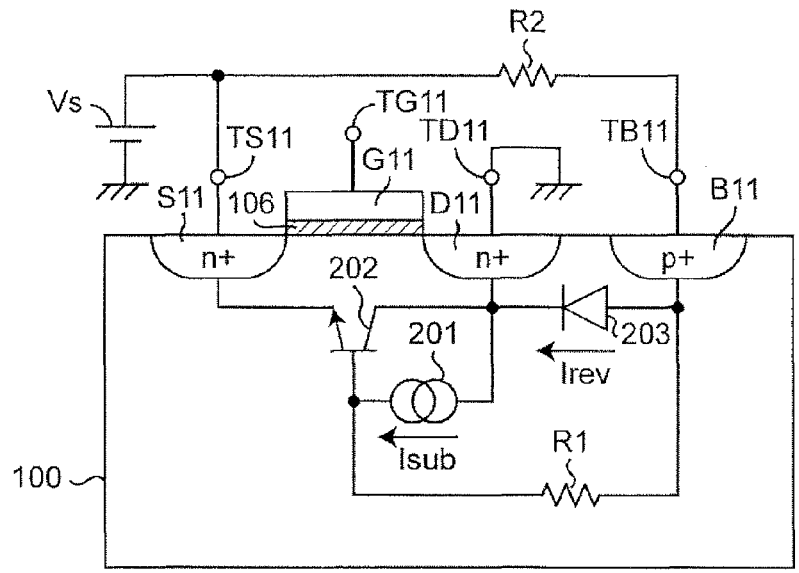
FIG. 37 is a cross section of a structure of a NMOS transistor according to the related art, also illustrating a circuit diagram thereof in which the potential of the source electrode is higher than the potential of the drain electrode, resulting in a flow of an inverse-flow current Irev.
Figure 38:
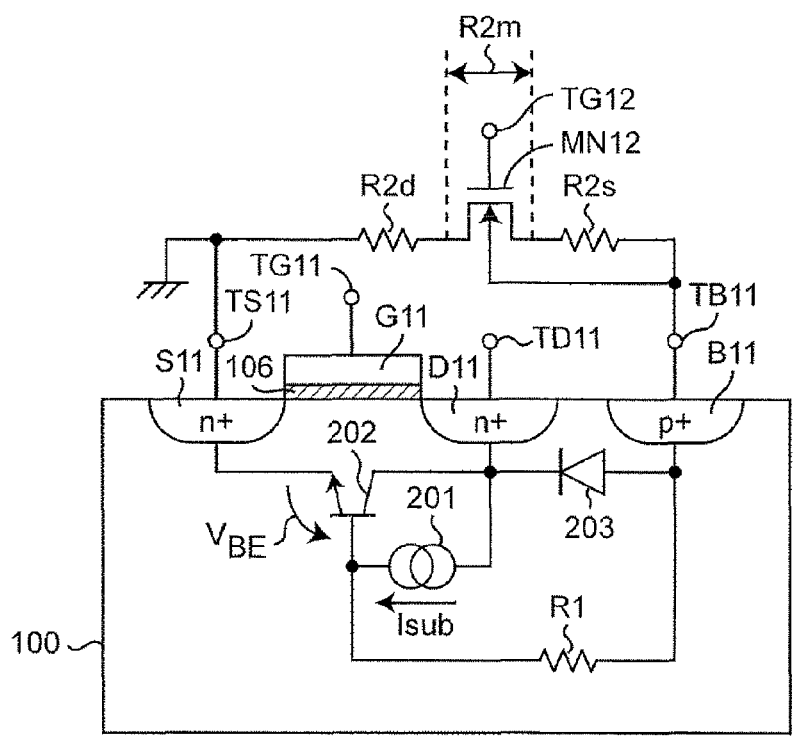
FIG. 38 is a cross section of a structure of a NMOS transistor according to the related art where a second NMOS transistor is provided between the source electrode and the substrate electrode of a first NMOS transistor.
Figure 39:
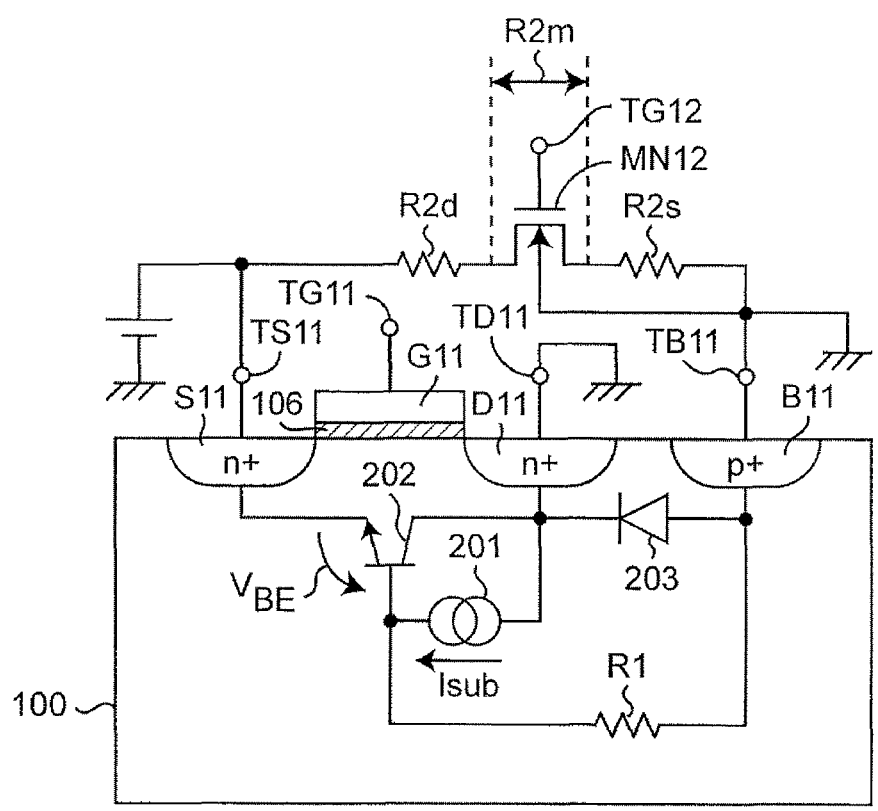
FIG. 39 is a cross section of a NMOS transistor according to the related art where a second NMOS transistor is provided between the source electrode and the substrate electrode of a first NMOS transistor.

Next, the occupied area of the semiconductor integrated circuit 1A-1 of FIG. 6 and its resistance in the substrate current path are described in comparison with the first NMOS transistors MN11 according to the related art illustrated in FIGS. 29 and 30. In the first NMOS transistors MN11 according to the related art illustrated in FIGS. 29 and 30, the p-type active regions B11 and the source regions S11 are formed separately. In this case, in order to form a separate second NMOS transistor MN12 for electrically connecting or disconnecting the p-type active regions B11 and the source regions S11, a new region would be required, which would result in an increase in the area of the semiconductor integrated circuit. Further, when the second NMOS transistor MN12 is formed, because there is a parasitic resistance in the wires from the p-type active regions B11 and the source regions S11 to the MOS transistor MN12, the resistance between the source electrodes TS11 and the substrate electrodes TB11 is increased. As described above, this will induce an operation of the parasitic bipolar transistor in the first NMOS transistor MN11.

Figure 8:
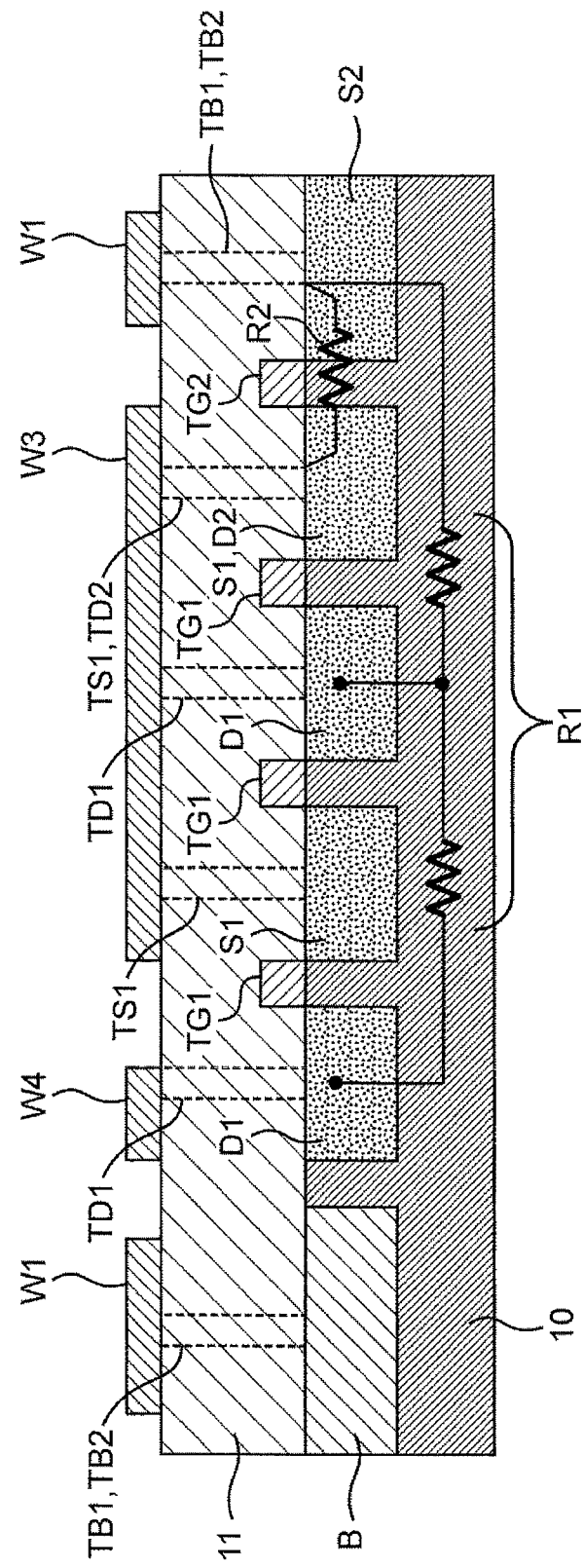
FIG. 8 is a cross section of the semiconductor integrated circuit illustrated in FIG. 6 taken along line A1-A2.

FIG. 8 is a cross section of the semiconductor integrated circuit 1A-1 taken along line A1-A2 of FIG. 6. As illustrated in FIG. 8, the p-type active region B, the drain regions D1 and D2, the source regions S1 and S2, and the gate electrodes TG1 and TG2 are formed in the semiconductor integrated circuit 1A-1. On top of these regions, the silicon oxide film 11 is formed, and the metal wires W1, W3, and W4 are further formed thereon. In FIG. 8, the substrate electrodes TB1 and TB2, the drain electrodes TD1 and TD2, and the source electrodes TS1, which are not directly visible in the cross section of FIG. 8, are indicated by dotted lines. Resistances R1 indicate the parasitic resistance of the p-type semiconductor substrate 10. A resistance R2 indicates the resistance between the substrate electrodes TB1 and TB2 and the source electrode TS1.

With reference to FIGS. 6 and 8, the resistance of the substrate current flow path is described. In FIG. 8, a substrate current due to holes generated near the drain regions D1 flows via the p-type semiconductor substrate 10 to the substrate electrodes TB1 and TB2. The resistance R1, which is a parasitic resistance of the p-type semiconductor substrate 10, is determined by dividing a sheet resistance of the p-type semiconductor substrate 10 with a substrate width, and then multiplying the result with an average substrate length. The sheet resistance of the p-type semiconductor substrate 10 is the resistance of a substrate with unit width and length. The substrate width may be substantially equal to the channel width of the second NMOS transistor MN2. The average substrate length is an average value of the distances from the substrate electrodes TB1 and TB2 to the corresponding drain electrodes TD1.

From the viewpoint of preventing the operation of the parasitic bipolar transistor of the first NMOS transistor MN1, it may be desirable to minimize the resistance R1. In order to minimize the resistance R1, it may be effective to minimize the distance between the substrate electrodes TB1 and TB2 and the drain electrodes TD1. This, however, is not desirable because the area that can be allocated to the first NMOS transistor MN1 is reduced by the area required for the substrate electrodes TB1 and TB2.

On the other hand, the resistance R2 from the substrate electrodes TB1 and TB2 to the source electrode TS1 is a total sum of a wire resistance R2$d$ from the source electrode TS1 of the first NMOS transistor MN1 to the drain electrode TD2 of the second NMOS transistor MN2, a wire resistance R2$s$ from the source electrode TS2 of the second NMOS transistor MN2 to the substrate electrodes TB1 and TB2, and an on-resistance R2$m$ of the second NMOS transistor MN2.

The second NMOS transistor MN2 may be provided by a transistor having a minimum channel length in a process of manufacturing the semiconductor integrated circuit 1A-1. The ratio of the channel width of the first NMOS transistor MN1 to the channel width of the second NMOS transistor MN2 corresponds to the ratio of the number of the gate electrodes TG1 disposed between the drain regions D1 and the source regions S1 of the first NMOS transistor MN1 and the number of the gate electrodes TG2 disposed between the drain region D2 and the source region S2 of the second NMOS transistor MN2 in the region surrounded by the p-type active regions B. Thus, by disposing the p-type active regions B at an appropriate interval, a channel width of the second NMOS transistor MN2 may be realized which is smaller than the channel width of the first NMOS transistor MN1 by a factor of several to several tens. Thus, the on-resistance R2$m$ of the second NMOS transistor MN2 can be reduced depending on the channel width of the first NMOS transistor MN1. Further, as illustrated in FIGS. 6 and 8, the wire resistances R2$d$ and R2$s$ can be minimized by reducing the distances between the substrate electrodes TB1 and TB2, the source electrode TS1, the drain electrode TD2, and the gate electrode TG2 to minimum distances allowed by the process.

Next, the occupied area of the semiconductor integrated circuit 1A-1 illustrated in FIG. 6 is described. In the semiconductor integrated circuit 1A-1, the first NMOS transistor MN1 and the second NMOS transistor MN2 include the source region S1 and drain region D2 that are formed in the same region, and the source electrodes TS1 and drain electrodes TD2 that are formed of the same electrodes. Thus, the first NMOS transistor MN1 and the second NMOS transistor MN2 can be formed in substantially the same area as the area required for forming the first NMOS transistor MN11 according to the related art illustrated in FIGS. 29 and 30.

In the structure of the semiconductor integrated circuit 1A-1 of FIG. 6, when the first NMOS transistor MN1 has a channel width of about 10,000 μm, the channel width of the second NMOS transistor MN2 may be about 3,300 μm, and the area required for the first NMOS transistor MN1 and the second NMOS transistor MN2 may be about 80,000 square μm. On the other hand, in the structure according to the related art illustrated in FIG. 30, when the first NMOS transistor MN11 has a channel width of about 10,000 μm, its area is about 75,000 square μm. When the second NMOS transistor MN12 has a channel width of about 3,300 µm, its area is about 7,200 square µm. Thus, a total require area is about 82,000 square µm. Thus, the occupied area of the semiconductor integrated circuit 1A-1 illustrated in FIG. 6 is reduced compared with the occupied area according to the related art.

As described above, in the semiconductor integrated circuits 1, 1A, 1B, 1-1, 1A-1, and 1B-1 according to the first embodiment, one or more of the structural elements of the first NMOS transistor MN1 and one or more of the structural elements of the second NMOS transistor MN2 are formed by the same structural elements or formed adjacently. Thus, the occupied area is reduced compared with the related art in which the second NMOS transistor MN12 is provided for isolating the source electrode TS11 of the first NMOS transistor MN11 and the substrate electrode TB11 from each other. Further, the resistance R2 of the substrate current flow path of the first NMOS transistor MN1 can be reduced by appropriately arranging and wiring the second NMOS transistor MN2. Thus, an increase in the potential of the p-type semiconductor substrate 10 can be prevented even when a substrate current flows. In this way, the operation of the parasitic bipolar transistor of the first NMOS transistor MN1 can be prevented.

Second Embodiment

Figure 9:
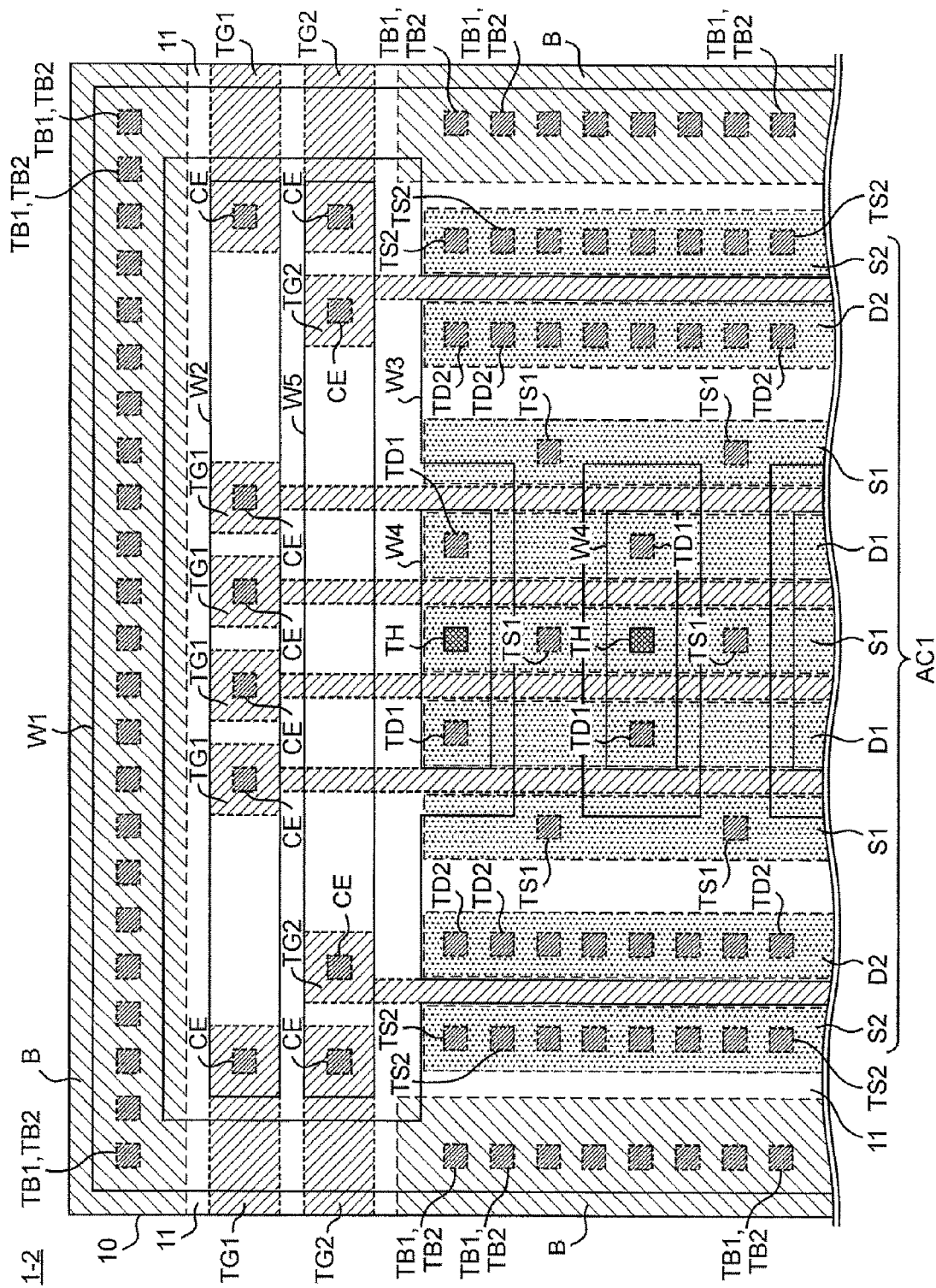
FIG. 9 is a plan view of a structure of a semiconductor integrated circuit according to a second embodiment of the present invention.

FIG. 9 is a plan view of a semiconductor integrated circuit 1-2 according to a second embodiment. The semiconductor integrated circuit 1-2 is wired in the same way as the first embodiment illustrated in FIG. 1. Compared with the semiconductor integrated circuit 1 of FIG. 2, the semiconductor integrated circuit 1-2 includes three source regions S1 with four gate electrodes TG1 formed between the source regions S1 and the drain regions D1; that the second NMOS transistor MN2 is also provided by the drain region D2, the drain electrodes TD2, the source region S2, the source electrodes TS2, and the gate electrode TG2 in the left side of FIG. 9; and that a plurality of the drain electrodes TD1 are connected via through-holes TH by wiring in an upper layer. The semiconductor integrated circuit 1-2 may be similar to the semiconductor integrated circuit 1 in other structures and operation.

Generally, when the first NMOS transistor MN1 includes an even number of gate electrodes TG1, the total number of the drain regions D1 and the source regions S1, i.e., the electrode regions between which the gate electrodes TG1 are located, is an odd number. Further, because the drain regions D1 and the source regions S1 are alternately formed with respect to the lateral direction of FIG. 9, the region closest to the p-type active regions B disposed on the right edge or left edge of FIG. 9 is either the drain region D1 or the source region S1. In this case, by disposing the source region S1 as the regions closest to the p-type active region B formed on the right edge and left edge of FIG. 9, the second NMOS transistor MN2, which is formed only in the right side in accordance with the first embodiment, can also be formed in the left side of FIG. 9.

In semiconductor integrated circuit 1-2 illustrated in FIG. 9, compared with the semiconductor integrated circuits 1, 1A, 1B, 1-1, 1A-1, and 1B-1 illustrated in FIGS. 2 through 7, respectively, four gate electrodes TG1 are provided and the second NMOS transistors MN2 are formed on both the left and right sides with respect to FIG. 9.

Figure 10:
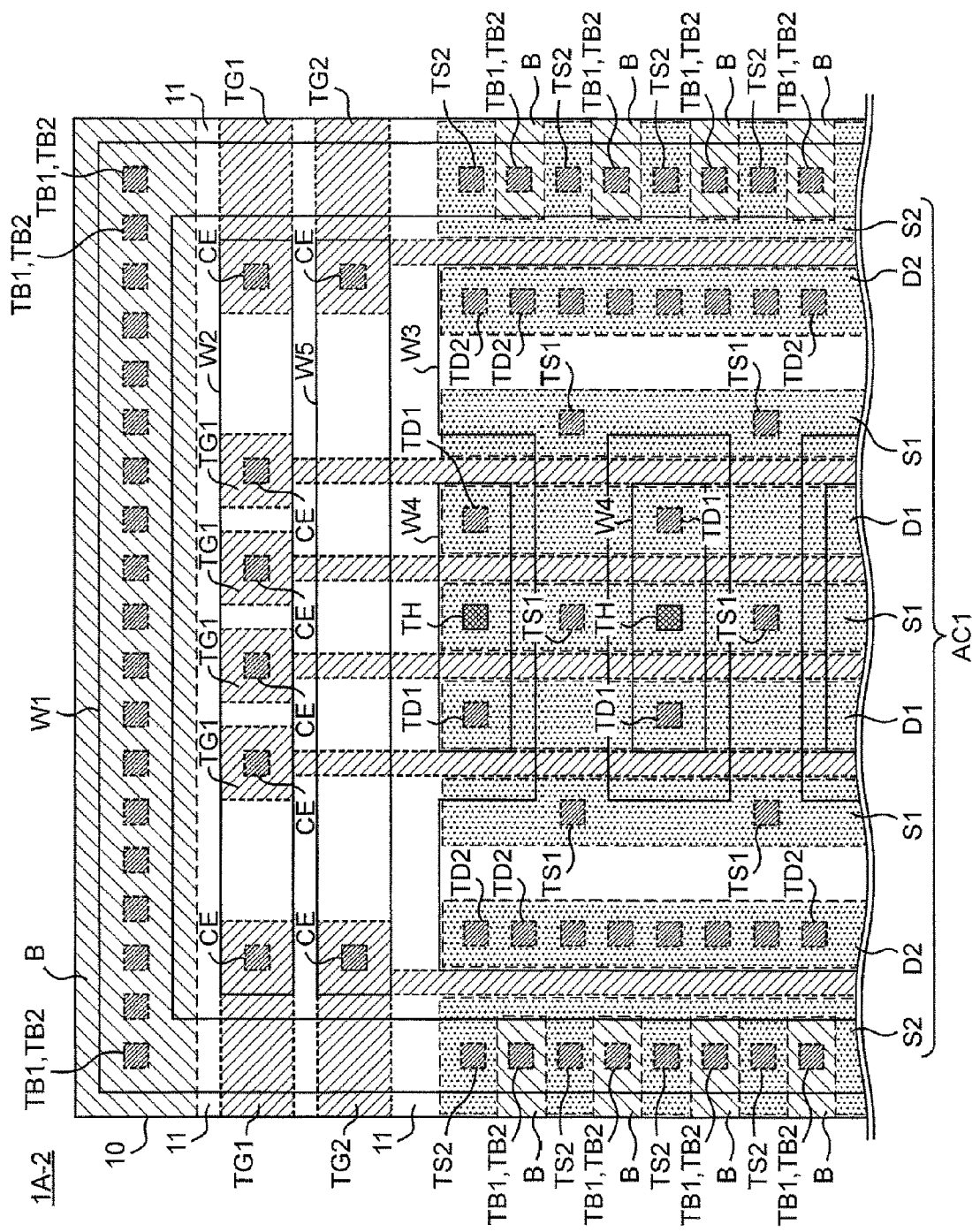
FIG. 10 is a plan view of a structure of a semiconductor integrated circuit according to a variation of the semiconductor integrated circuit illustrated in FIG. 9.

FIG. 10 is a plan view of a semiconductor integrated circuit 1A-2, which is a variation of the semiconductor integrated circuit 1-2 of FIG. 9. In the semiconductor integrated circuit 1A-2, compared with the semiconductor integrated circuit 1-2 of FIG. 9, the source region S2 and the p-type active region B are formed adjacent to each other in lower left and lower right portions of FIG. 10. The semiconductor integrated circuit 1A-2 may be similar to the semiconductor integrated circuit 1-2 in other structures and operation. The semiconductor integrated circuit 1A-2 provides the effect of further decreasing the occupied area compared with the semiconductor integrated circuit 1-2 of FIG. 9.

Figure 11:
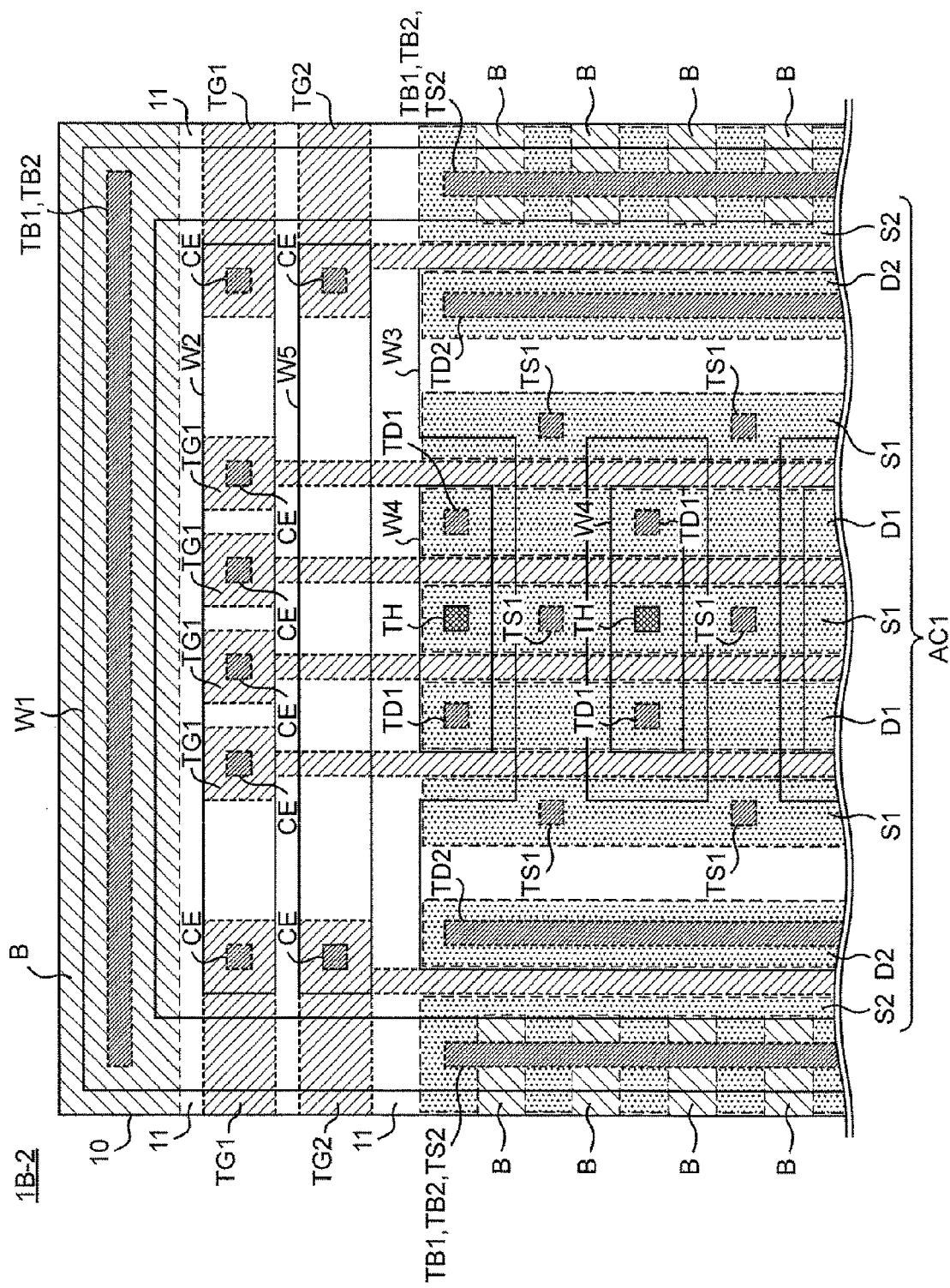
FIG. 11 is a plan view of a structure of a semiconductor integrated circuit according to a variation of the semiconductor integrated circuit illustrated in FIG. 10.

FIG. 11 is a plan view of a semiconductor integrated circuit 1B-2 which is a variation of the semiconductor integrated circuit 1A-2 of FIG. 10. In the semiconductor integrated circuit 1B-2, compared with the semiconductor integrated circuit 1A-2 of FIG. 10, the source electrodes TS2 and the substrate electrodes TB1 and TB2 are formed of the same electrode in the lower left and lower right sides of FIG. 11. The p-type active region B formed in the upper side of FIG. 11 includes a single substrate electrode of TB1 and TB2. The drain regions D2 formed in the left side and right side of FIG. 11 each include a single drain electrode TD2. The semiconductor integrated circuit 1B-2 may be similar to the semiconductor integrated circuit 1A-2 in other structures and operation. The structure of the semiconductor integrated circuit 1B-2 may be formed by a process capable of forming a contact electrode extending between a p-type active region and a n-type active region.

In the semiconductor integrated circuits 1-2, 1A-2, and 1B-2 illustrated in FIGS. 9 through 11, the source regions S1 of the first NMOS transistor MN1 and the drain regions D2 of the second NMOS transistors MN2 are both n-type active regions AC1. Thus, the source regions S1 of the first NMOS transistor MN1 and the drain regions D2 of the second NMOS transistors MN2 may be formed in the same region. Semiconductor integrated circuits of such structures are illustrated in FIGS. 12 through 14.

Figure 12:
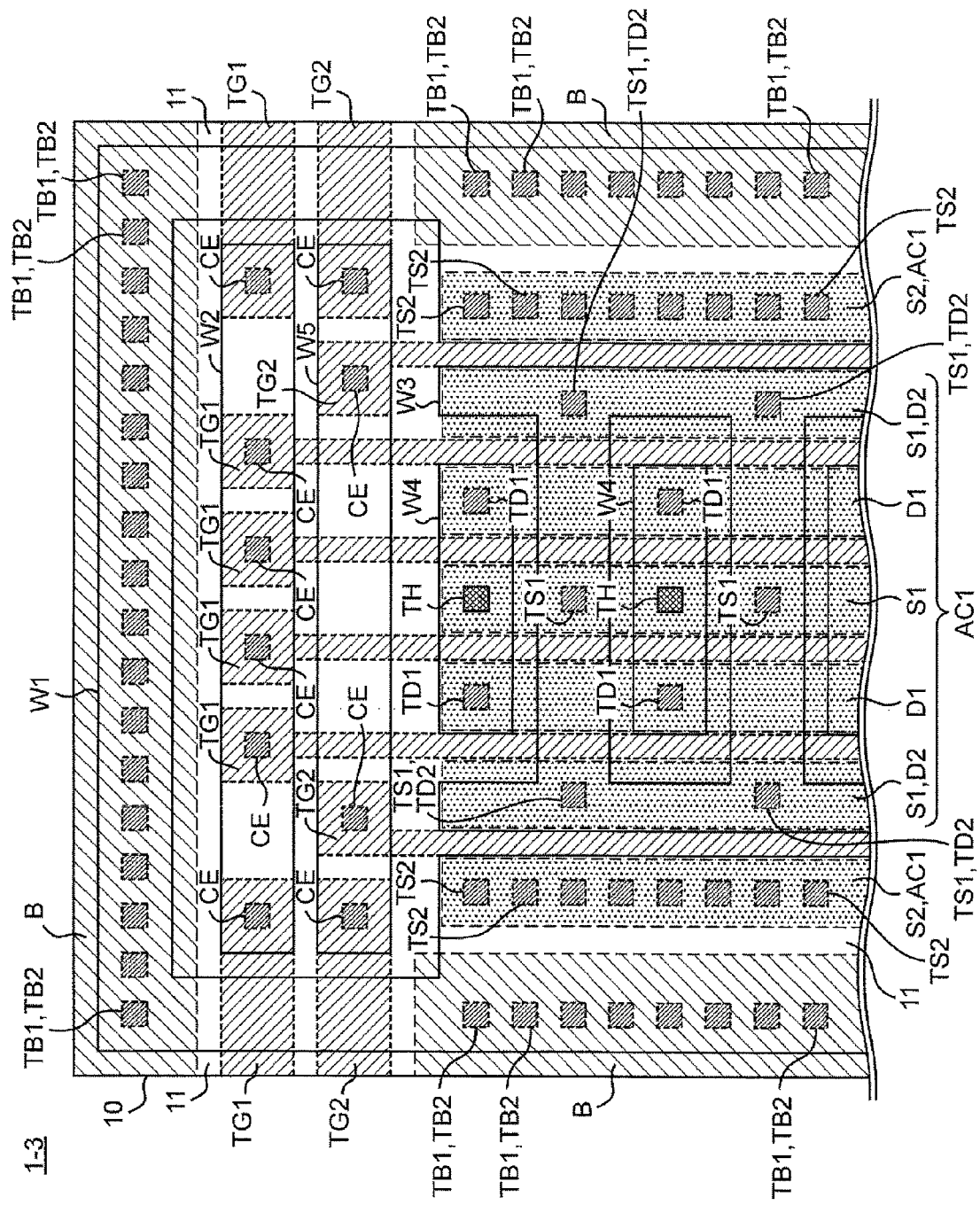
FIG. 12 is a plan view of a structure of a semiconductor integrated circuit according to a variation of the semiconductor integrated circuit illustrated in FIG. 9.

FIG. 12 is a plan view of a semiconductor integrated circuit 1-3 which is a variation of the semiconductor integrated circuit 1-2 of FIG. 9. In the semiconductor integrated circuit 1-3, compared with the semiconductor integrated circuit 1-2 of FIG. 9, the right-most source region S1 and the right-most drain region D2 are provided in the same region. The left-most source region S1 and the left-most drain region D2 are formed in the same region. In each of the regions of S1 and D2, the source electrodes TS1 and the drain electrodes TD2 are formed of the same electrodes. The semiconductor integrated circuit 1-3 may be similar to the semiconductor integrated circuit 1-2 in other structures and operation. The semiconductor integrated circuit 1-3 provides the effect of further decreasing the occupied area compared with the semiconductor integrated circuit 1-2 of FIG. 9.

Figure 13:
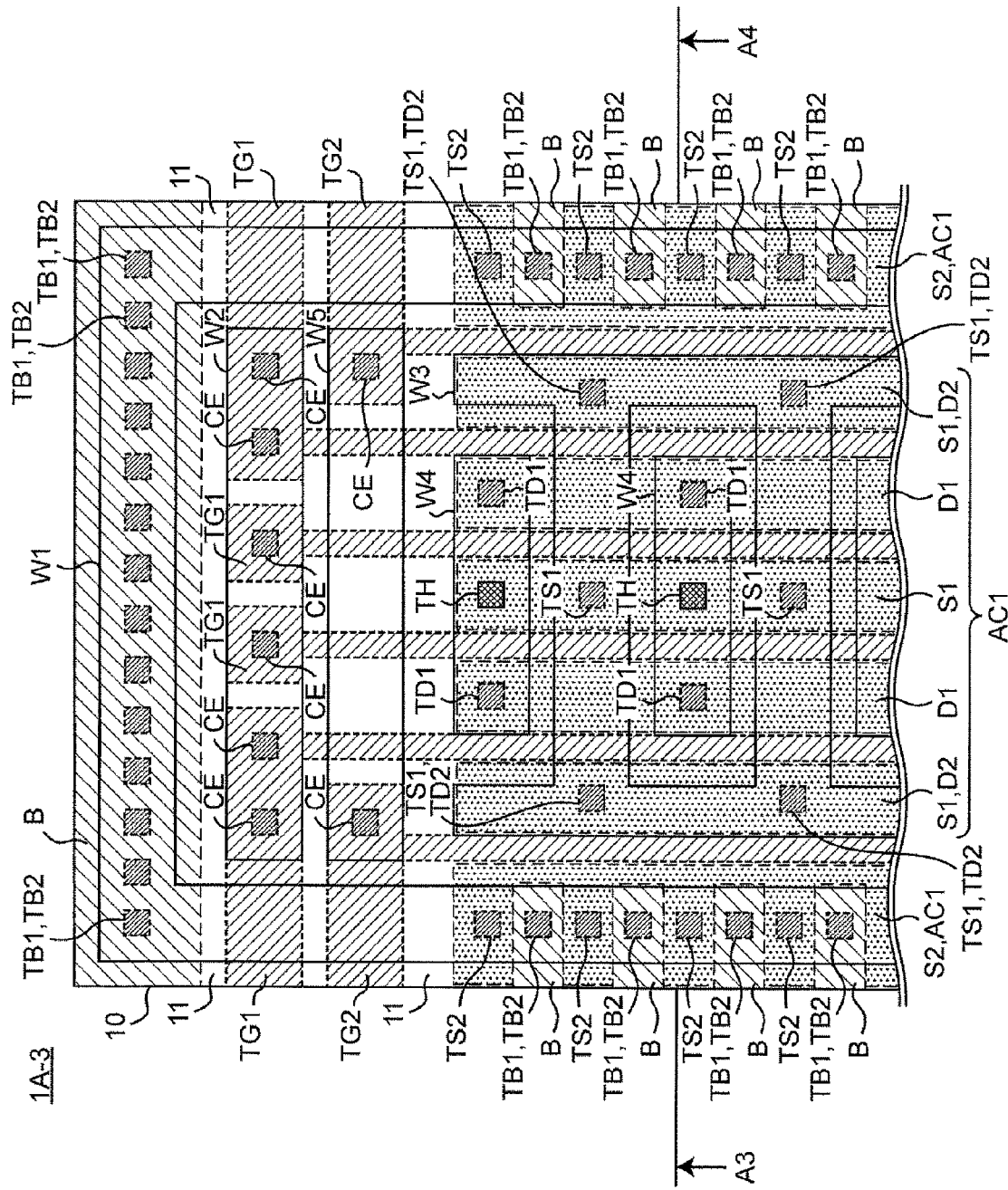
FIG. 13 is a plan view of a structure of a semiconductor integrated circuit according to a variation of the semiconductor integrated circuit illustrated in FIG. 10.

FIG. 13 is a plan view of a semiconductor integrated circuit 1A-3 which is a variation of the semiconductor integrated circuit 1A-2 of FIG. 10. In the semiconductor integrated circuit 1A-3, compared with the semiconductor integrated circuit 1A-2 of FIG. 10, the right-most source region S1 and the right-most drain region D2 are formed in the same region. The left-most source region S1 and the left-most drain region D2 are formed in the same region. In each of the same regions of S1 and D2, the source electrodes TS1 and the drain electrodes TD2 are formed of the same electrodes. The semiconductor integrated circuit 1A-3 may be similar to the semiconductor integrated circuit 1A-2 in other structures and operation. The semiconductor integrated circuit 1A-3 provides the effect of further decreasing the occupied area compared with the semiconductor integrated circuit 1A-2 of FIG. 10.

Figure 14:
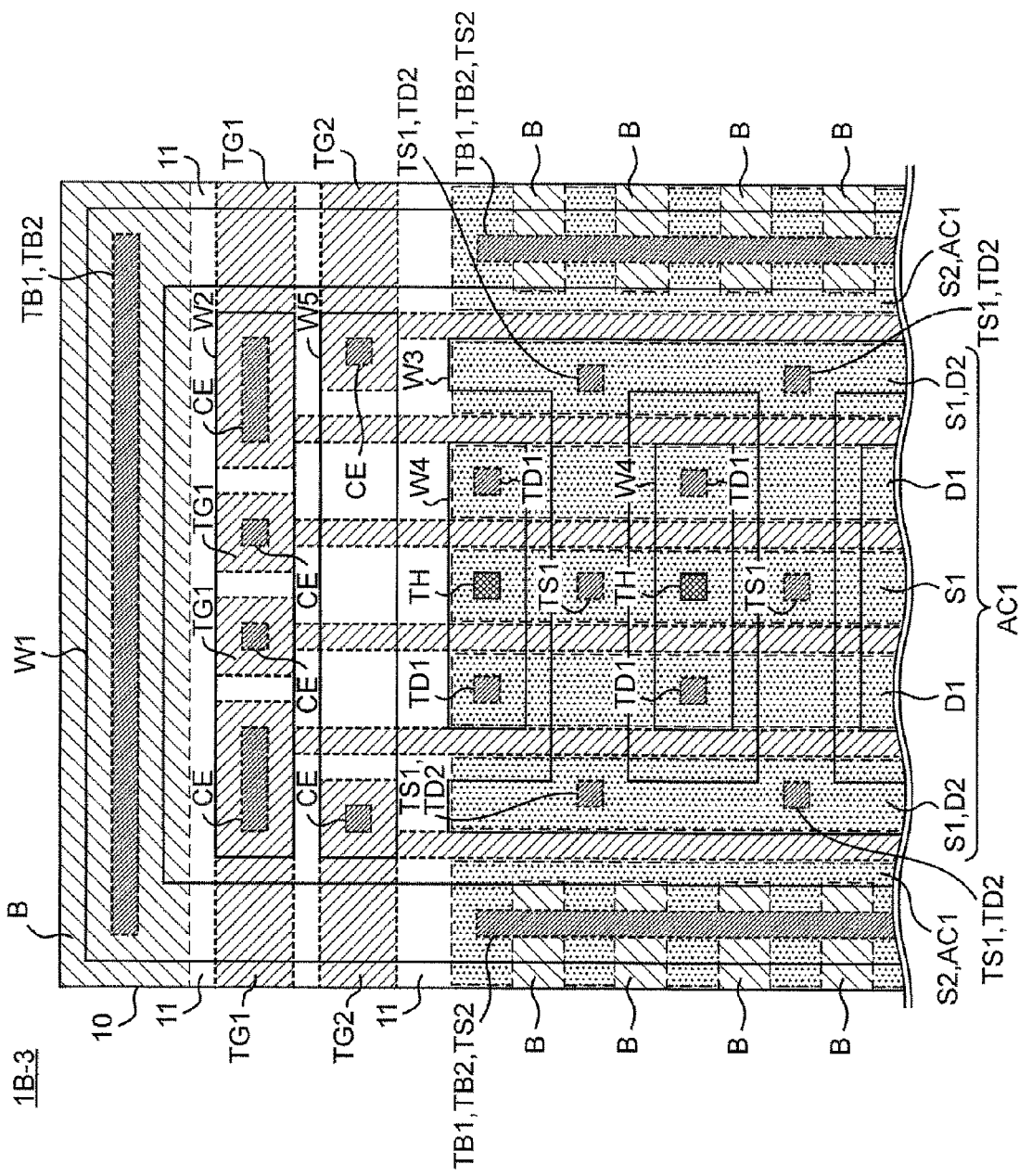
FIG. 14 is a plan view of a structure of a semiconductor integrated circuit according to a variation of the semiconductor integrated circuit illustrated in FIG. 11.

FIG. 14 is a plan view of a semiconductor integrated circuit 1B-3 which is a variation of the semiconductor integrated circuit 1B-2 of FIG. 11. In the semiconductor integrated circuit 1B-3, compared with the semiconductor integrated circuit 1B-2, the right-most source region S1 and the right-most drain region D2 are formed in the same region. The left-most source region S1 and the left-most drain region D2 are formed in the same region. In each of the same regions of S1 and D2, the source electrodes TS1 and the drain electrodes TD2 are formed of the same electrodes. The semiconductor integrated circuit 1B-3 may be similar to the semiconductor integrated circuit 1B-2 in other structures and operation. The semiconductor integrated circuit 1B-3 provides the effect of further decreasing the occupied area compared with the semiconductor integrated circuit 1B-2 of FIG. 11.

Figure 15:
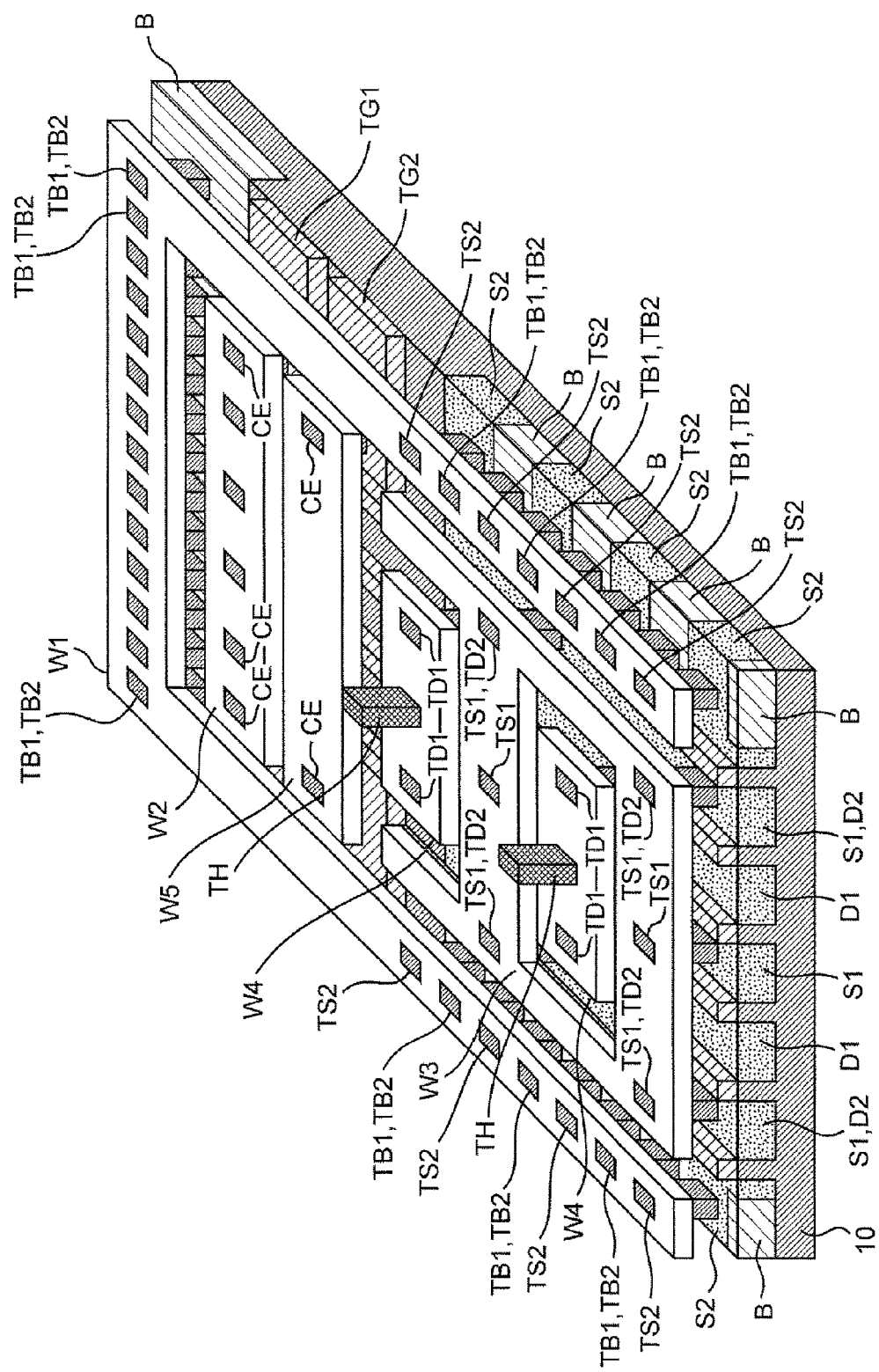
FIG. 15 is a perspective view of the semiconductor integrated circuit illustrated in FIG. 13.
Figure 16:
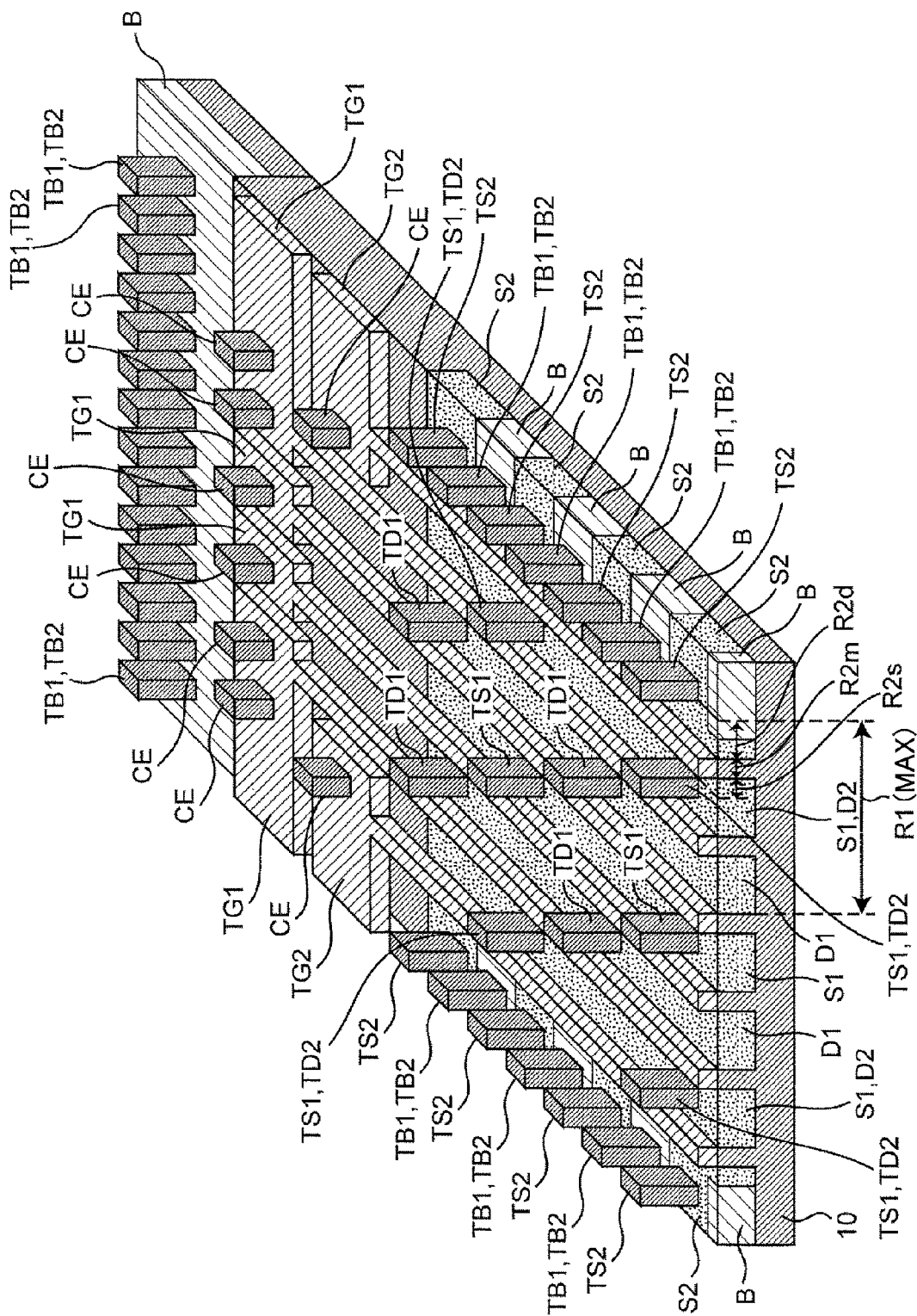
FIG. 16 is a perspective view of the semiconductor integrated circuit of FIG. 13 from which a wiring layer and above are removed.
Figure 17:
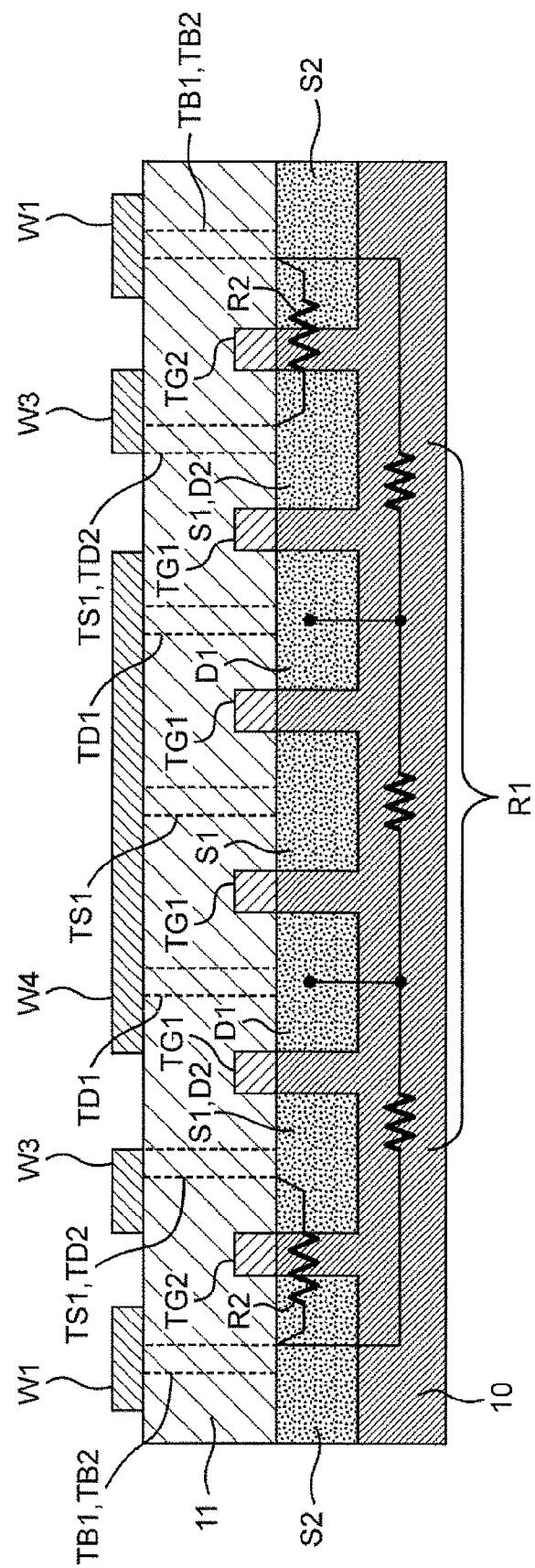
FIG. 17 is a cross section of the semiconductor integrated circuit taken along line A3-A4 of FIG. 13.

FIG. 15 is a perspective view of the semiconductor integrated circuit 1A-3 of FIG. 13. FIG. 16 is a perspective view of the semiconductor integrated circuit 1A-3 where a wiring layer and above are removed. In FIGS. 15 and 16, the silicon oxide film 11 is omitted for improving visual understanding. Further, FIG. 17 is a cross section of the semiconductor integrated circuit 1A-3 taken along line A3-A4 of FIG. 13. In FIG. 17, the substrate electrodes TB1 and TB2, the drain electrodes TD1 and TD2, and the source electrode TS1, which are actually not directly visible in the cross section of FIG. 17, are indicated by dotted lines. With reference to FIGS. 13, 15, 16, and 17, the resistance of the substrate current flow path is described.

In the semiconductor integrated circuit 1A-3 of FIG. 13, the second NMOS transistors MN2 are formed in both the left and right sides of FIG. 13. Thus, the distance between the substrate electrodes TB1 and TB2 and the most-distant drain electrode TD1 from the substrate electrodes TB1 and TB2 is reduced compared with the semiconductor integrated circuit according to the first embodiment. With reference to FIG. 17, in the semiconductor integrated circuit 1A-3, the substrate current flows from each of the drain regions D1 to the substrate electrodes TB1 and TB2 in the right and left edges of FIG. 17. Thus, the resistance R1, i.e., the parasitic resistance of the p-type semiconductor substrate 10 in the substrate current flow path, includes a path to the left side and a path to the right side which are parallel to each other, as illustrated in FIG. 17. Thus, the parasitic resistance R1 is about one half the parasitic resistance R1 of the p-type semiconductor substrate 10 in the semiconductor integrated circuit according to the first embodiment. Further, the paths from the source electrodes TS1 to the substrate electrodes TB1 and TB2 include a path from the right-most source electrode TS1 to the substrate electrodes TB1 and TB2 on the right edge of FIG. 17, and a path from the left-most source electrode TS1 to the substrate electrodes TB1 and TB2 on the left edge of FIG. 17. Thus, the resistance R2 due to the NMOS transistors also includes the parallel paths to the left and right sides, so that the resistance R2 is about one half the resistance R2 of the semiconductor integrated circuit according to the first embodiment. Thus, in the semiconductor integrated circuit according to the second embodiment, the resistances R1 and R2 of the substrate current flow path are reduced compared with those of the semiconductor integrated circuit according to the first embodiment. Thus, even when the substrate current flows, the increase in the potential of the p-type semiconductor substrate 10 can be more effectively prevented, so that the operation of the parasitic bipolar transistor of the first NMOS transistor MN1 caused by the substrate current can be more effectively prevented. However, in this case, the multiple drain electrodes TD1 are independently formed as illustrated in FIG. 13 or 15. Thus, the drain electrodes TD1 may be connected by an upper-layer wiring via through-holes TH.

As described above, in addition to the effects provided by the first embodiment, the second embodiment provides the following effects. Namely, because the second embodiment includes the two second NMOS transistors MN2, the resistances R1 and R2 of the substrate current flow path of the first NMOS transistor MN1 can be reduced more than in the first embodiment. Thus, even when the substrate current flows, the increase in the potential of the p-type semiconductor substrate 10 can be more effectively prevented. Thus, the effect of preventing the operation of the parasitic bipolar transistor of the first NMOS transistor MN1 can be improved.

While in the second embodiment the semiconductor integrated circuit is structured by forming the two second NMOS transistors MN2 on the right and left sides with respect to FIGS. 9 through 14, the present invention is not limited to such embodiments. Preferably, the second NMOS transistors MN2 may be formed in one of the right side and the left side.

Third Embodiment

Figure 18:
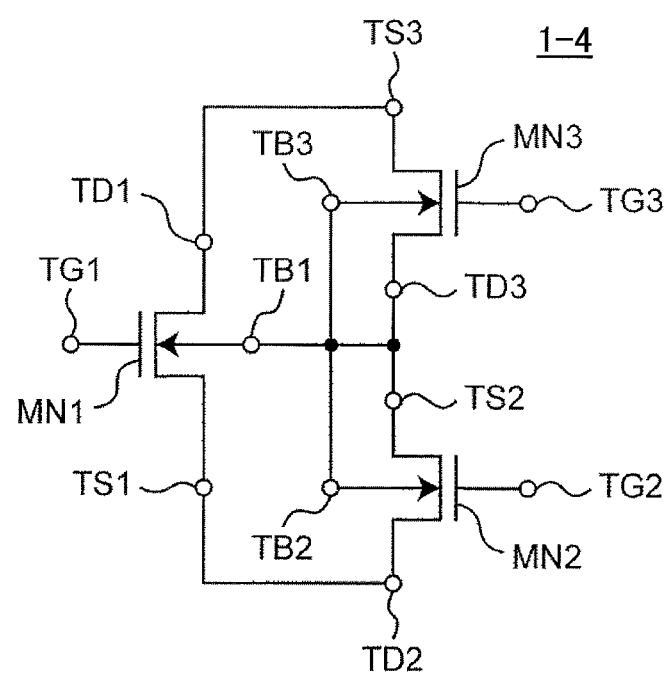
FIG. 18 is a circuit diagram of a semiconductor integrated circuit according to a third embodiment of the present invention.

FIG. 18 is a circuit diagram of a semiconductor integrated circuit 1-4 according to a third embodiment. In the semiconductor integrated circuit 1-4 illustrated in FIG. 18, compared with the semiconductor integrated circuit 1 of FIG. 1, a third NMOS transistor MN3 is additionally provided. The third NMOS transistor MN3 includes a source electrode TS3, a gate electrode TG3, a drain electrode TD3, and a substrate electrode TB3. In FIG. 18, the source electrode TS3 is connected to the drain electrode TD1. The drain electrode TD3 and the substrate electrode TB3 are connected to the source electrode TS2, the substrate electrode TB1, and the substrate electrode TB2. In the semiconductor integrated circuit 1-4, the substrate electrode TB1 and the source electrode TS1 may be electrically connected to or disconnected from each other by a control voltage applied to the gate electrode TG2 of the second NMOS transistor MN2. The substrate electrode TB1 and the drain electrode TD1 may be electrically connected to or disconnected from each other by a control voltage applied to the gate electrode TG3 of the third NMOS transistor MN3.

Figure 19:
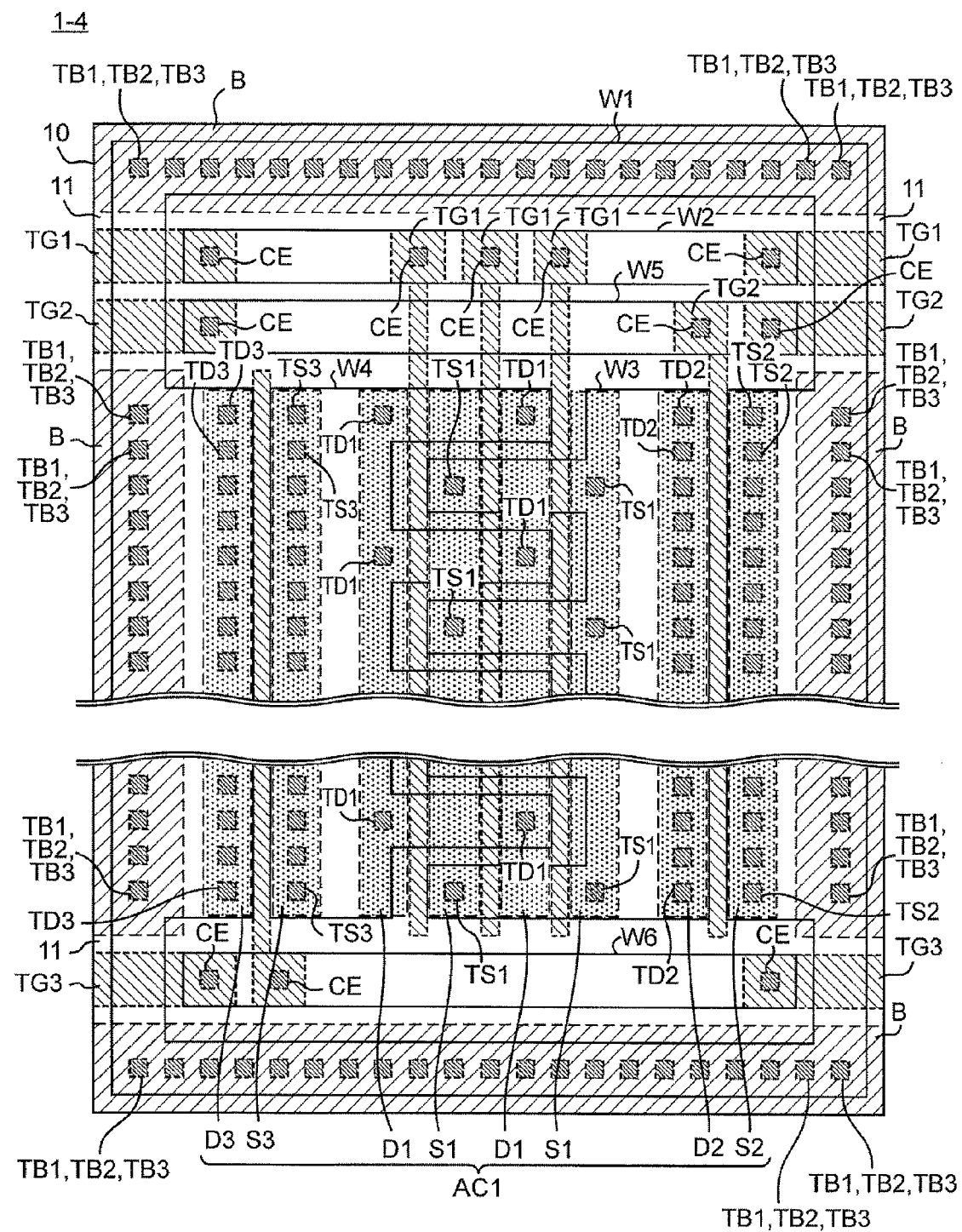
FIG. 19 is a plan view of a structure of the semiconductor integrated circuit illustrated in FIG. 18.

FIG. 19 is a plan view of the semiconductor integrated circuit 1-4 of FIG. 18. The semiconductor integrated circuit 1-4 of FIG. 19, compared with the semiconductor integrated circuit 1 of FIG. 2, further includes the gate electrodes TG3 indicated by the first hatching which may include polysilicon electrodes formed on the p-type semiconductor substrate 10; a drain region D3 indicated by the second hatching which is formed as a n-type active region AC1 on the p-type semiconductor substrate 10; a plurality of drain electrodes TD3 connected to the drain region D3; a source region S3 indicated by the second hatching which is formed as a n-type active region AC1 on the p-type semiconductor substrate 10; a plurality of source electrodes TS3 connected to the source region S3; a plurality of substrate electrodes TB3 connected to the p-type active regions B; and a metal wire W6 connecting a plurality of contact electrodes CE connected to the gate electrodes TG3. The metal wire W1 connects the substrate electrodes TB1, TB2, and TB3, the source electrodes TS2, and the drain electrodes TD3. The metal wire W4 connects the drain electrodes TD1 and the source electrodes TS3. The semiconductor integrated circuit 1-4 may be similar to the semiconductor integrated circuit 1 in other structures and operation.

In FIG. 19, the third NMOS transistor MN3 of FIG. 18 includes the p-type semiconductor substrate 10, the drain region D3, the source region S3, the p-type active regions B, the drain electrodes TD3, the source electrodes TS3, the substrate electrodes TB3, and the gate electrodes TG3. The first NMOS transistor MN1, the second NMOS transistor MN2, and the third NMOS transistor MN3 share the p-type semiconductor substrate 10 and the p-type active regions B. The substrate electrodes TB1, TB2, and TB3 are formed of the same electrodes.

Generally, when the first NMOS transistor MN1 includes an odd number of gate electrodes TG1, the sum of the number of the drain regions D1 and the source regions S1, i.e., the electrode regions between which the gate electrodes TG1 are disposed, is an even number. Further, because the drain regions D1 and the source regions S1 are alternately formed in the lateral direction in FIG. 19, there may be the following two cases:

(1) a case where the region closest to the p-type active region B on the right edge of the figure is the source region S1, and the region closest to the p-type active region B formed on the left edge of the figure is the drain region D1; and
(2) a case where the region closest to the p-type active region B formed on the right edge of the figure is the drain region D1 and the region closest to the p-type active region B formed on the left edge of the figure is the source region S1.

In the first case, the second NMOS transistor MN2 may be disposed between the right-most p-type active region B and the source region S1 closest to the right-most p-type active region B. The third NMOS transistor MN3 may be disposed between the left-most p-type active region B and the drain region D1 closest to the left-most p-type active region B. In this way, the source electrodes TS1 of the first NMOS transistor MN1 can be electrically connected to or disconnected from the substrate electrodes TB1, TB2, TB3 of the first through third NMOS transistors MN1, MN2, and MN3, respectively, by a control voltage applied to the gate electrodes TG2 of the second NMOS transistor MN2. Also, the drain electrodes TD1 of the first NMOS transistor MN1 can be electrically connected to or disconnected from the substrate electrodes TB1, TB2, TB3 of the first through third NMOS transistors MN1, MN2, and MN3, respectively, by a control voltage applied to the gate electrodes TG3 of the third NMOS transistor MN3.

In the second case, the third NMOS transistor MN3 may be disposed between the right-most p-type active region B and the drain region D1 closest to the right-most p-type active region B. Also, the second NMOS transistor MN2 may be disposed between the left-most p-type active region B and the source region S1 closest to the left-most p-type active region B. In this way, the source electrodes TS1 of the first NMOS transistor MN1 can be electrically connected to or disconnected from the substrate electrodes TB1, TB2, and TB3 of the first through third NMOS transistors MN1, MN2, and MN3, respectively, by a control voltage applied to the gate electrodes TG2 of the second NMOS transistor MN2. Also, the drain electrodes TD1 of the first NMOS transistor MN1 can be electrically connected to or disconnected from the substrate electrodes TB1, TB2, and TB3 of the first through third NMOS transistors MN1, MN2, and MN3, respectively, by a control voltage applied to the gate electrodes TG3 of the third NMOS transistor MN3.

In the semiconductor integrated circuit 1-4, 1A-4, 1B-4, 1-5, 1A-5, and 1B-5 illustrated in FIGS. 19 through 24, respectively, the third NMOS transistor MN3 is formed in the left side of FIG. 19, compared with the semiconductor integrated circuits 1, 1A, 1B, 1-1, 1A-1, and 1B-1 illustrated in FIGS. 2 through 7.

Figure 20:
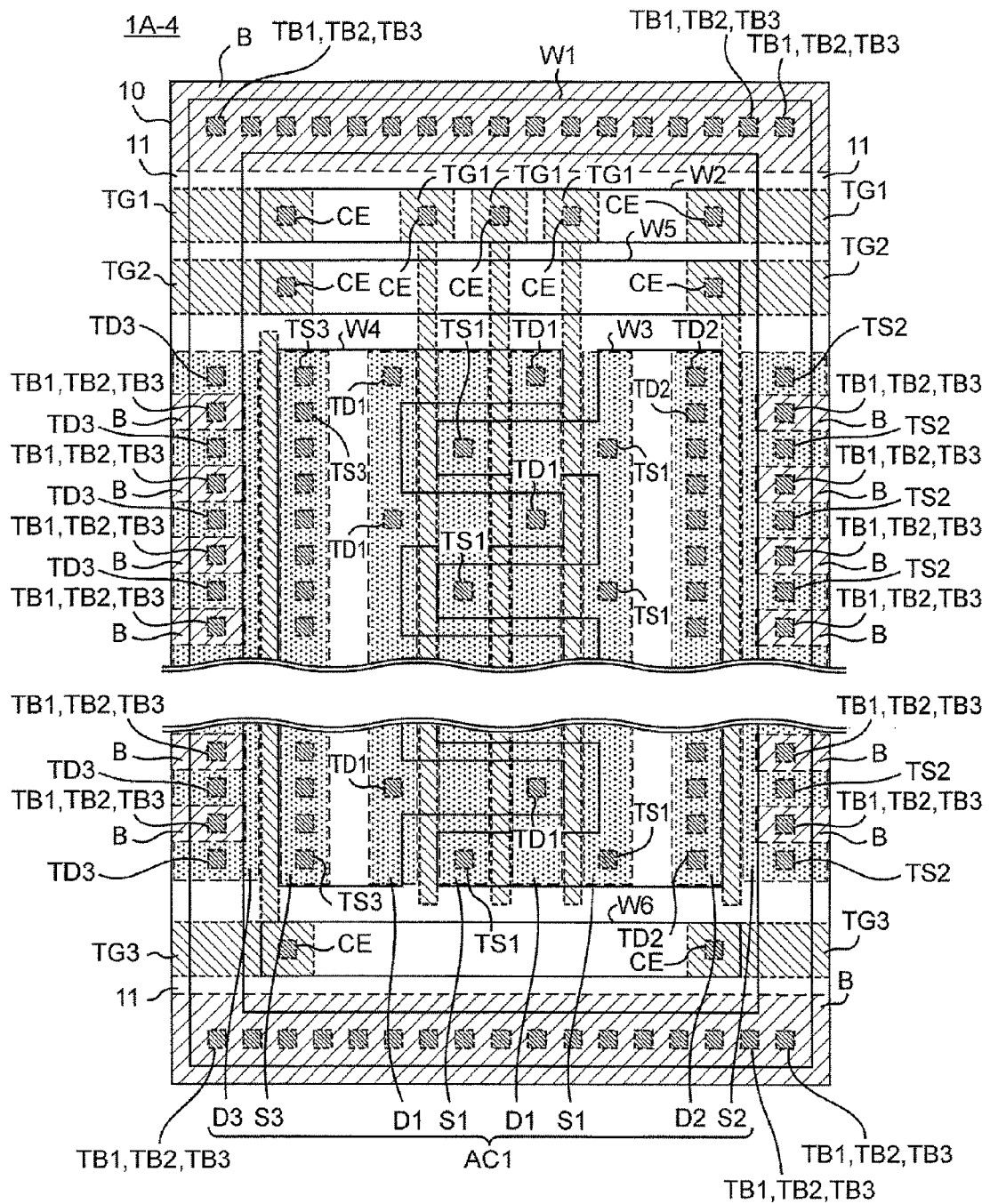
FIG. 20 is a plan view of a structure of a semiconductor integrated circuit according to a variation of the semiconductor integrated circuit of FIG. 19.

FIG. 20 is a plan view of a semiconductor integrated circuit 1A-4 which is a variation of the semiconductor integrated circuit 1-4 illustrated in FIG. 19. In the semiconductor integrated circuit 1A-4, compared with the semiconductor integrated circuit 1-4 of FIG. 19, the source region S2 and the p-type active region B are formed adjacent to one another in the right edge of FIG. 20, and the drain region D3 and the p-type active region B are formed adjacent to one another in the left edge of FIG. 20. The semiconductor integrated circuit 1A-4 may be similar to the semiconductor integrated circuit 1-4 in other structures and operation. The semiconductor integrated circuit 1A-4 of FIG. 20 provides the effect of further decreasing the occupied area, compared with the semiconductor integrated circuit 1-4 of FIG. 19.

Figure 21:
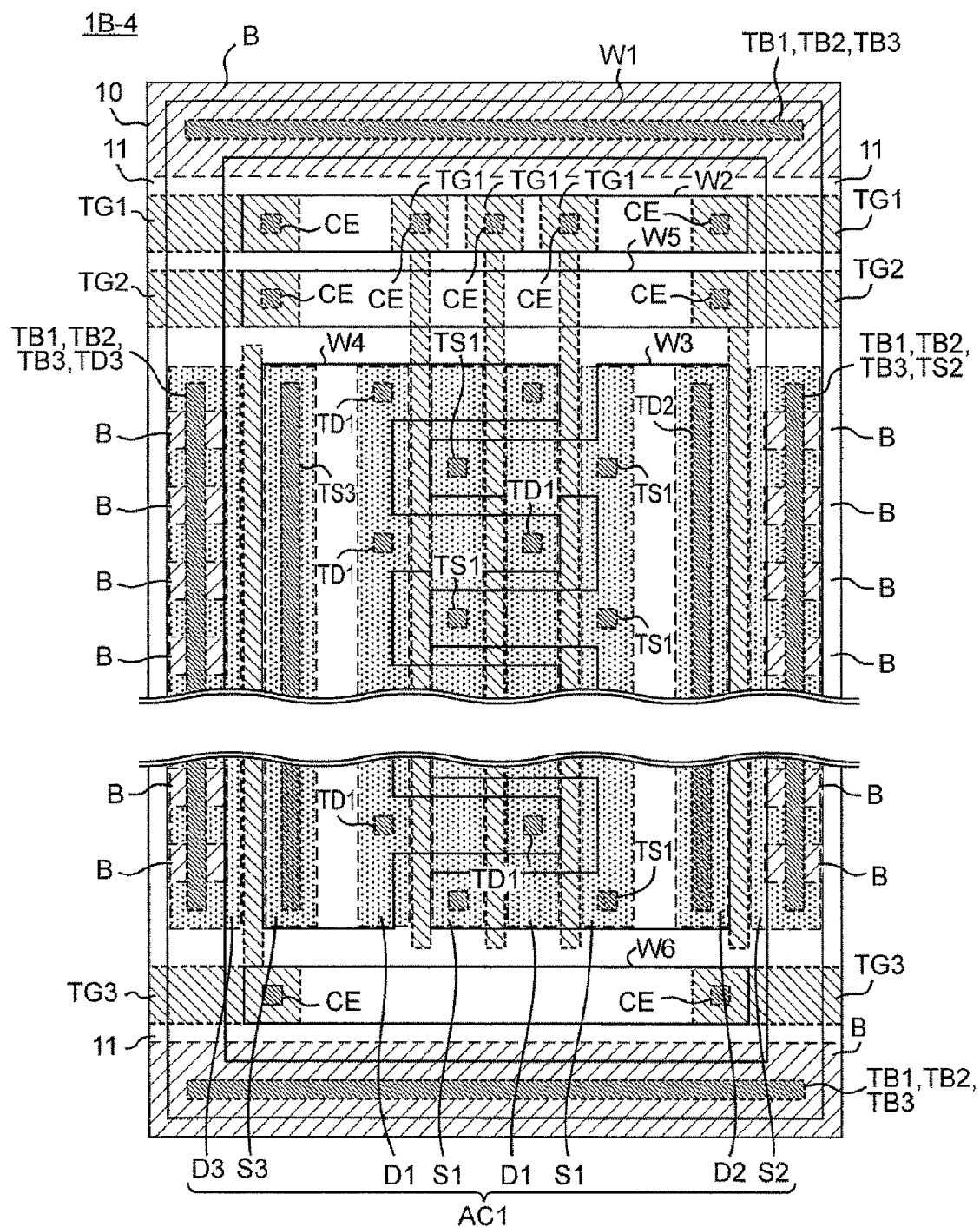
FIG. 21 is a plan view of a structure of a semiconductor integrated circuit according to a variation of the semiconductor integrated circuit of FIG. 20.

FIG. 21 is a plan view of a semiconductor integrated circuit 1B-4 which is a variation of the semiconductor integrated circuit 1A-4 of FIG. 20. In the semiconductor integrated circuit 1B-4, compared with the semiconductor integrated circuit 1A-4 of FIG. 20, the source electrode TS2 and the substrate electrodes TB1, TB2, and TB3 are formed of the same electrode in the right side. The drain electrode TD3 and the substrate electrodes TB1, TB2, and TB3 are formed of the same electrode in the left side. The p-type active regions B formed in the upper side and lower side of FIG. 21 each include a single substrate electrode of TB1, TB2, and TB3. The drain region D2 includes a single drain electrode TD2. And the source region S3 includes a single source electrode TS3. The semiconductor integrated circuit 1B-4 may be similar to the semiconductor integrated circuit 1A-4 in other structures and operation. The structure of the semiconductor integrated circuit 1B-4 may be formed by a process capable of forming a contact electrode extending between a p-type active region and an n-type active region.

In the semiconductor integrated circuits 1-4, 1A-4, and 1B-4 illustrated in FIGS. 19 through 21, the source region S1 of the first NMOS transistor MN1 and the drain region D2 of the second NMOS transistor MN2 are both n-type active regions AC1. Thus, the source region S1 of the first NMOS transistor MN1 and the drain region D2 of the second NMOS transistor MN2 may be provided in the same region. Further, because the drain region D1 of the first NMOS transistor MN1 and the source region S3 of the third NMOS transistor MN3 are both n-type active regions AC1, the drain region D1 of the first NMOS transistor MN1 and the source region S3 of the third NMOS transistor MN3 may be provided in the same region. In this case, the semiconductor integrated circuit may be as illustrated in FIGS. 22 through 24.

Figure 22:
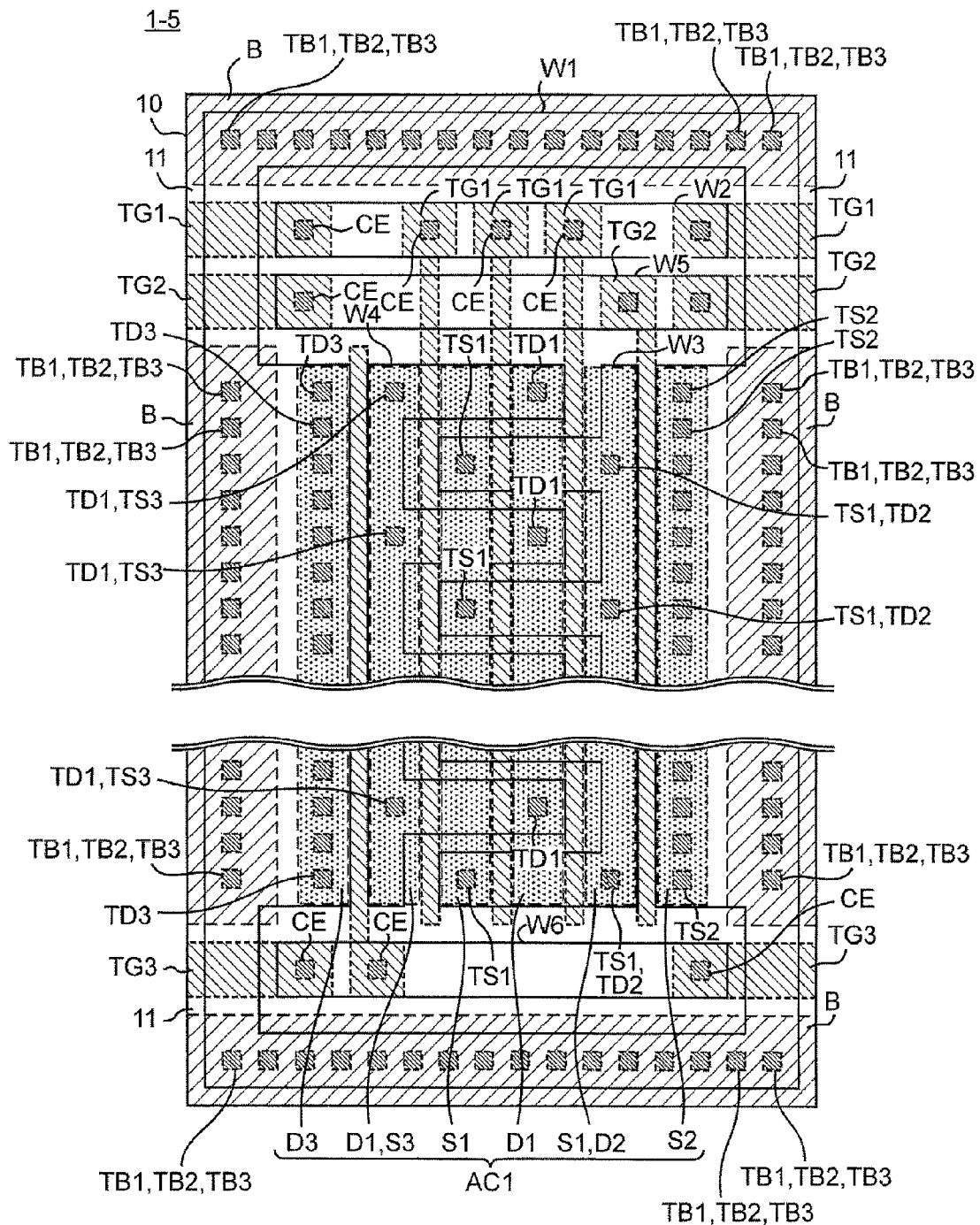
FIG. 22 is a plan view of a structure of a semiconductor integrated circuit according to a variation of the semiconductor integrated circuit of FIG. 19.

FIG. 22 is a plan view of a semiconductor integrated circuit 1-5 which is a variation of the semiconductor integrated circuit 1-4 of FIG. 19. In the semiconductor integrated circuit 1-5, compared with the semiconductor integrated circuit 1-4 of FIG. 19, the right-most source region S1 and the drain region D2 are provided in the same region in which the source electrodes TS1 and the drain electrodes TD2 are formed of the same electrodes. The left-most drain region D1 and the source region S3 formed in the same region in which the drain electrodes TD1 and the source electrodes TS3 are formed of the same electrodes. The semiconductor integrated circuit 1-5 may be similar to the semiconductor integrated circuit 1-4 in other structures and operation. The semiconductor integrated circuit 1-5 provide the effect of further decreasing the occupied area compared with the semiconductor integrated circuit 1-4 of FIG. 19.

Figure 23:
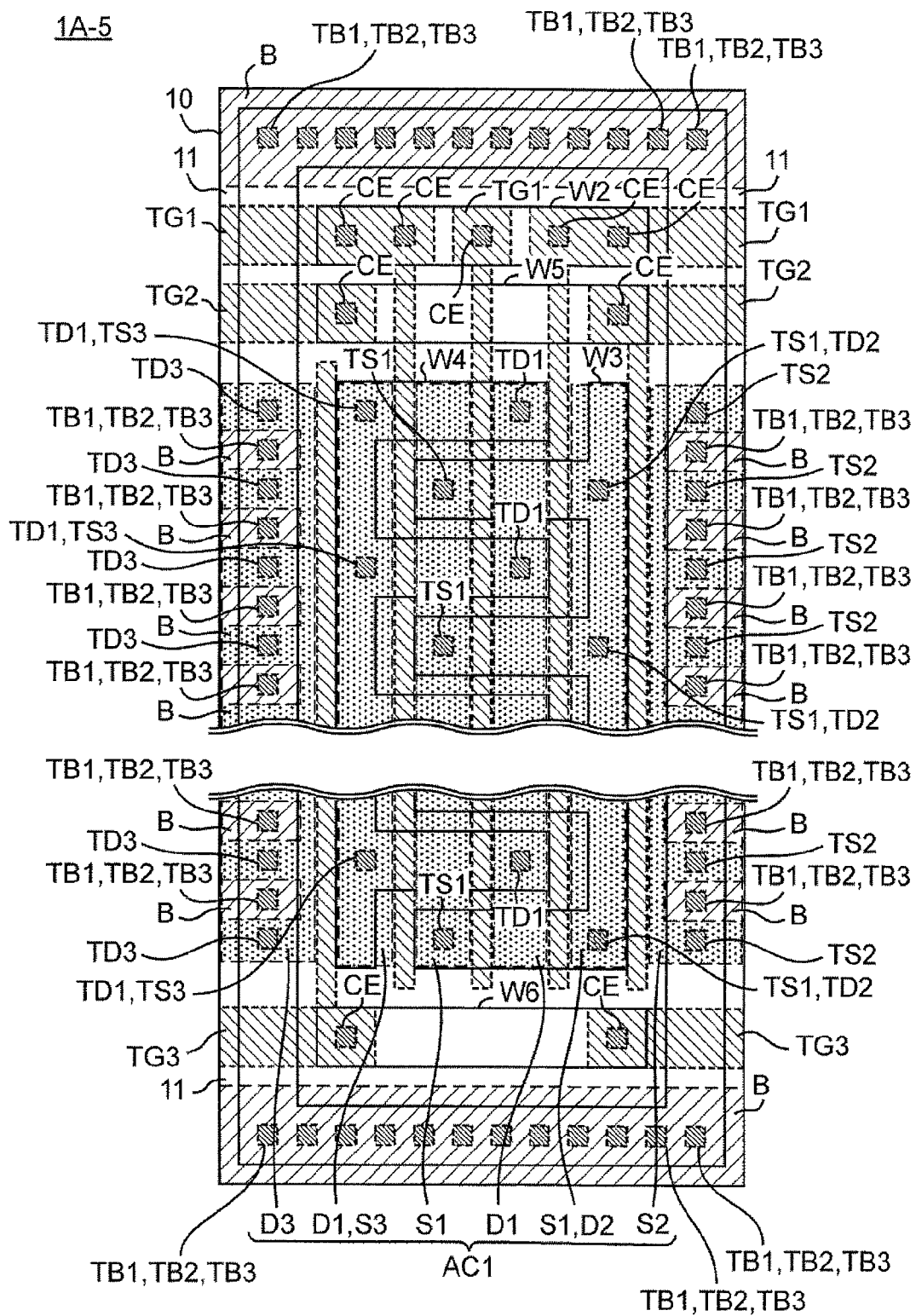
FIG. 23 is a plan view of a semiconductor integrated circuit according to a variation of the semiconductor integrated circuit of FIG. 20.

FIG. 23 is a plan view of a semiconductor integrated circuit 1A-5 which is a variation of the semiconductor integrated circuit 1A-4 of FIG. 20. In the semiconductor integrated circuit 1A-5, compared with the semiconductor integrated circuit 1A-4 of FIG. 20, the right-most source region S1 and the drain region D2 are provided in the same region in which the source electrodes TS1 and the drain electrodes TD2 are formed of the same electrodes. The left-most drain region D1 and the source region S3 are provided in the same region in which the drain electrodes TD1 and the source electrodes TS3 are formed of the same electrodes. The semiconductor integrated circuit 1A-5 may be similar to the semiconductor integrated circuit 1A-4 in other structures and operation. The semiconductor integrated circuit 1A-5 provides the effect of further decreasing the occupied area, compared with the semiconductor integrated circuit 1A-4 of FIG. 20.

Figure 24:
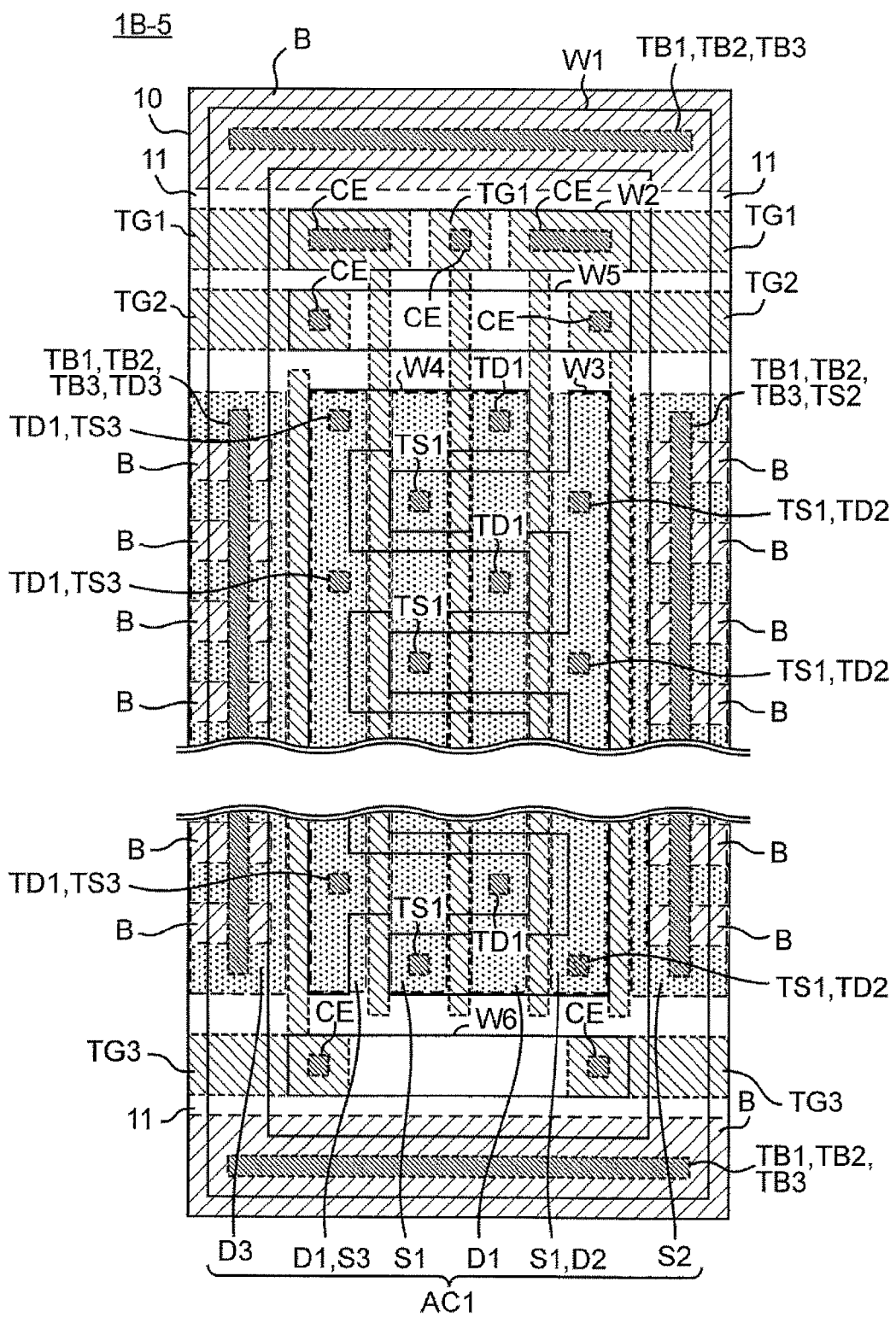
FIG. 24 is a plan view of a semiconductor integrated circuit according to a variation of the semiconductor integrated circuit of FIG. 21.

FIG. 24 is a plan view of a semiconductor integrated circuit 1B-5 which is a variation of the semiconductor integrated circuit 1B-4 of FIG. 21. In the semiconductor integrated circuit 1B-5, compared with the semiconductor integrated circuit 1B-4 of FIG. 21, the right-most source region S1 and the drain region D2 are formed in the same region in which the source electrodes TS1 and the drain electrodes TD2 are formed of the same electrodes. The left-most drain region D1 and the source region S3 are formed in the same region in which the drain electrodes TD1 and the source electrodes TS3 are formed of the same electrodes. The semiconductor integrated circuit 1B-5 may be similar to the semiconductor integrated circuit 1B-4 in other structures and operation. The semiconductor integrated circuit 1B-5 provides the effect of further decreasing the occupied area compared with the semiconductor integrated circuit 1B-4 of FIG. 21.

As described above, in addition to providing the effects of the first embodiment, the third embodiment provides the following effects. Namely, when the potential relationship between the drain region D1 and the source region S1 is reversed such that the potential of the source region S1 is higher than the potential of the drain region D1, the substrate electrode TB1 and the drain electrode TD1 can be electrically connected to each other via a low resistance path by using the third NMOS transistor MN3.

The foregoing embodiments are merely examples. In a preferred embodiment, the second or third NMOS transistor MN2 or MN3 with an appropriate configuration may be formed in accordance with various configurations of the first NMOS transistor MN1. Such an embodiment can also provide the effect of reducing the resistance of the substrate current flow path.

Figure 25:
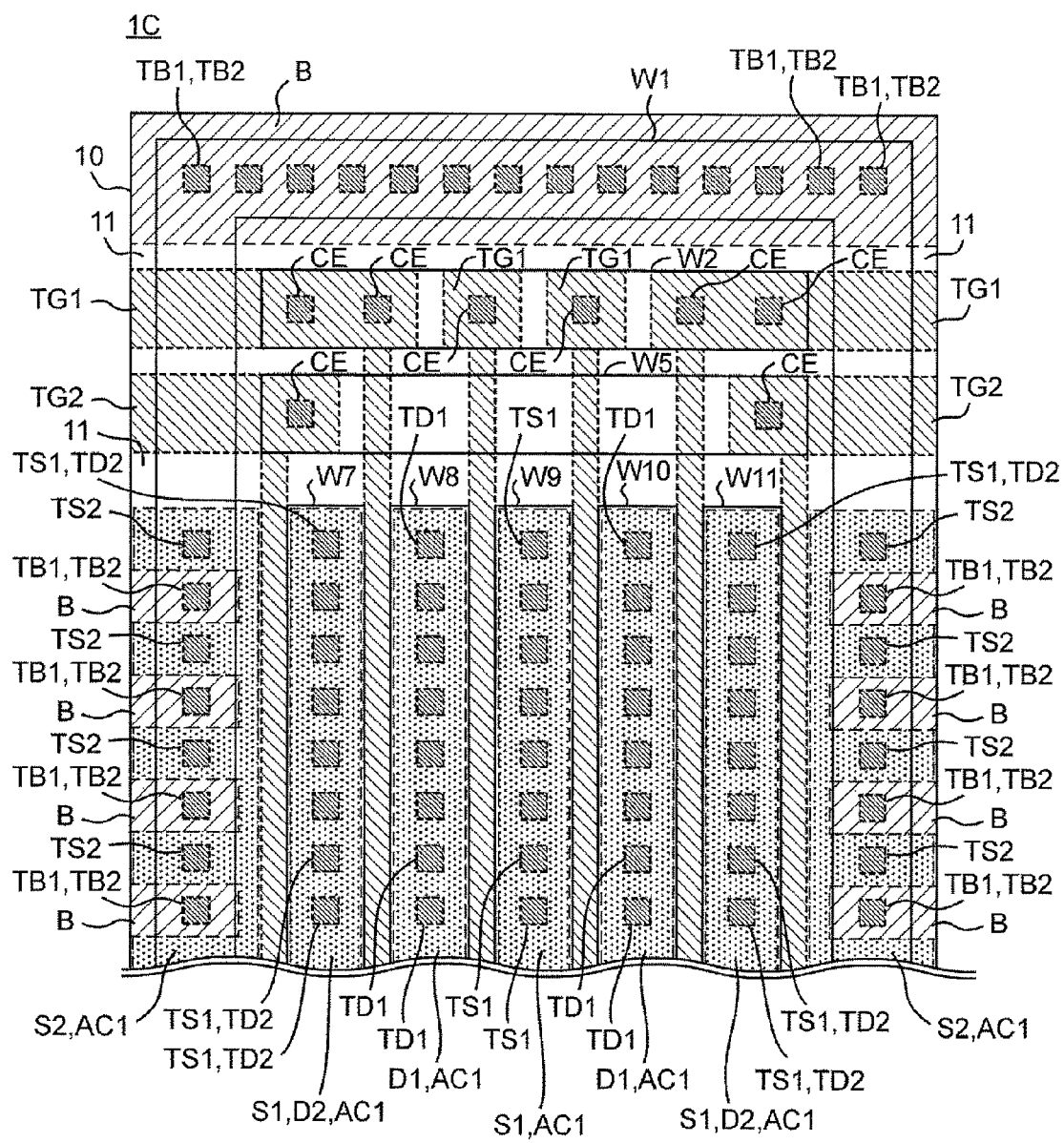
FIG. 25 is a plan view of a semiconductor integrated circuit according to a first applied example.
Figure 26:
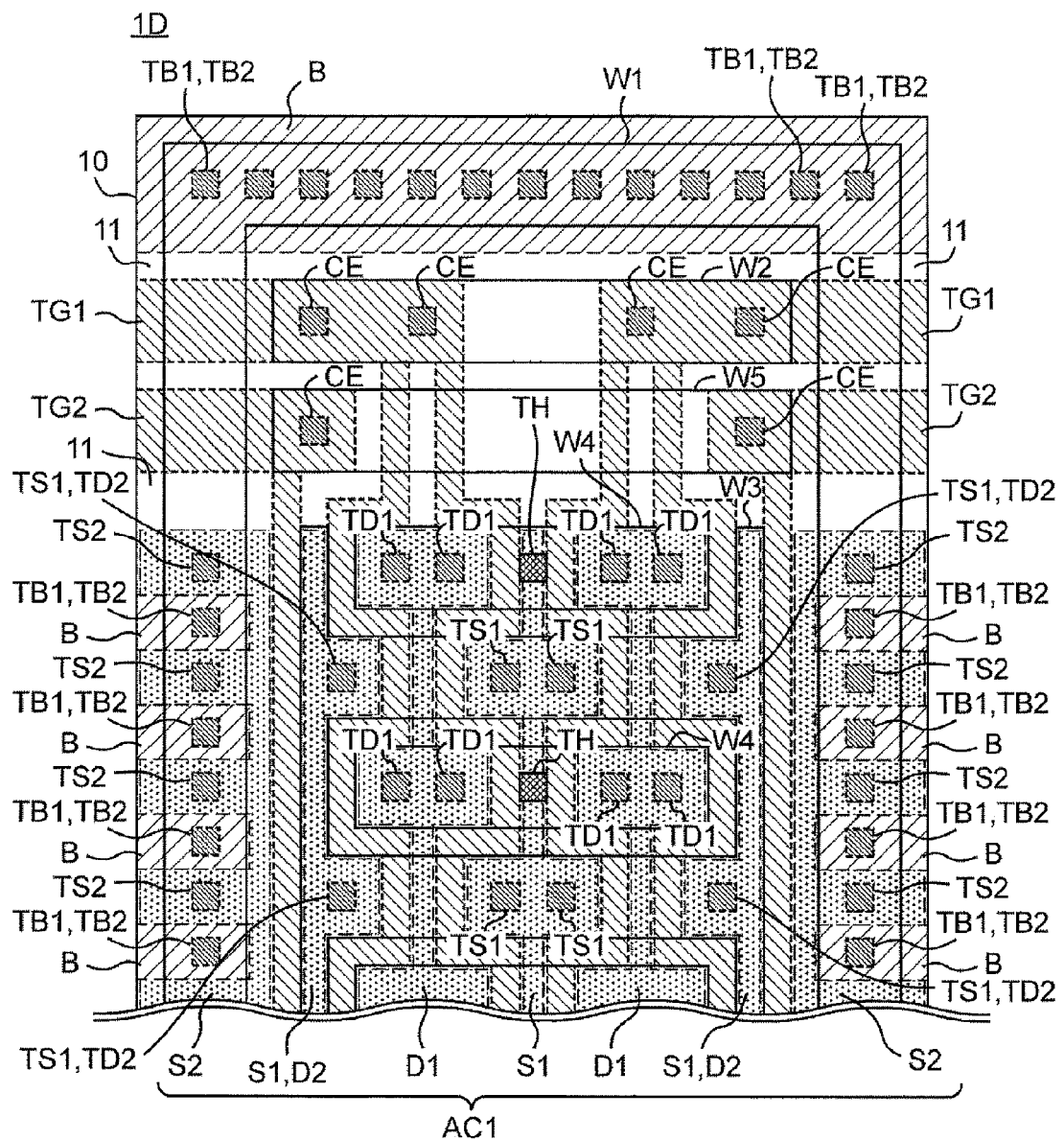
FIG. 26 is a plan view of a semiconductor integrated circuit according to a second applied example.
Figure 27:
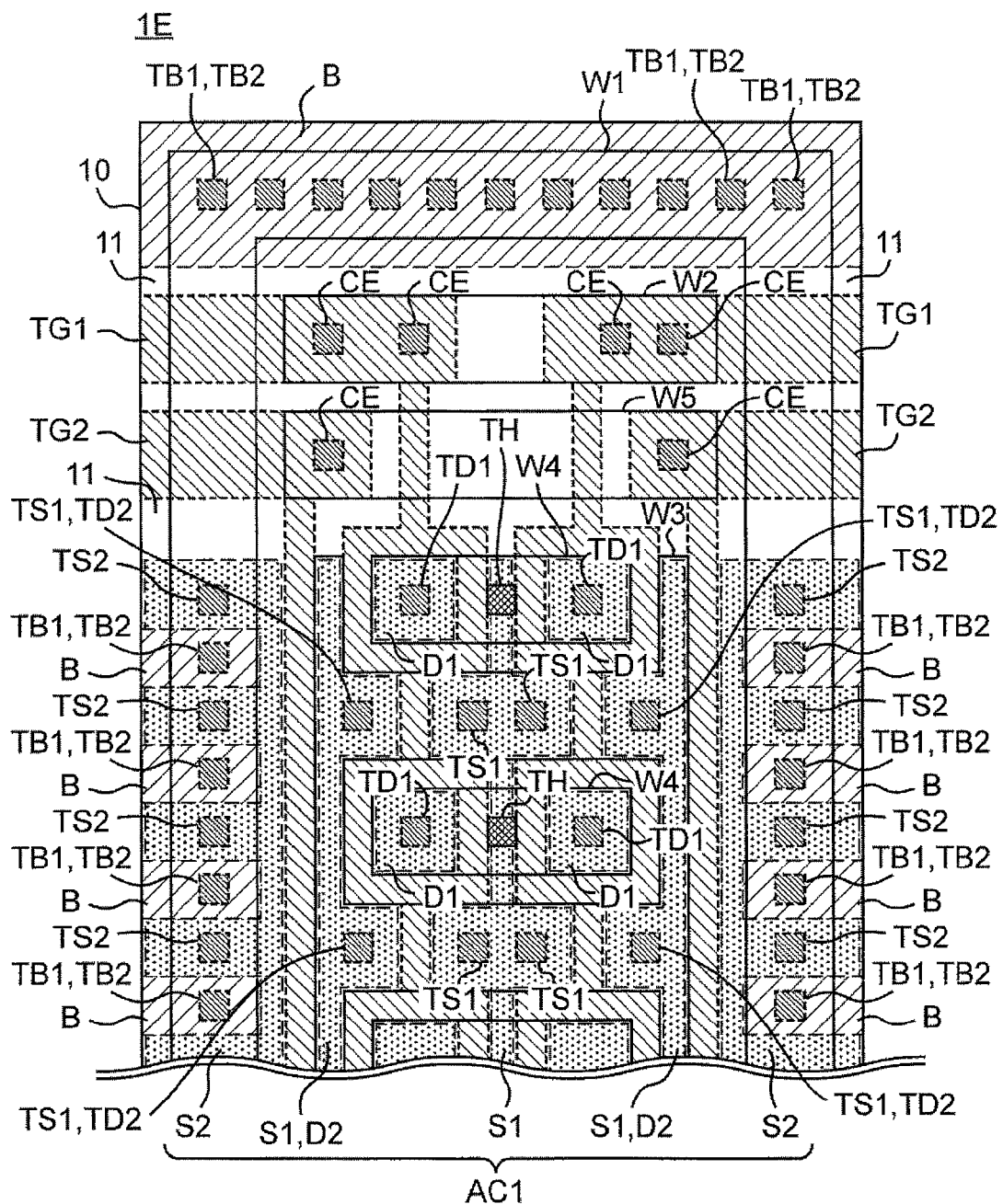
FIG. 27 is a plan view of a semiconductor integrated circuit according to a third applied example.

In accordance with an embodiment, when the drain region D1 or the source region S1 is proximate to the p-type active region B in various configurations of the first NMOS transistor MN1, the second NMOS transistor MN2 may be disposed between the drain region D1 or the source region S1 and the p-type active region B, whereby the effect of reducing the resistance of the substrate current flow path can be obtained. FIGS. 25 through 27 illustrate semiconductor integrated circuits 1C, 1D, and 1E according to such an embodiment.

FIG. 25 is a plan view of the semiconductor integrated circuit 1C according to a first applied example. In the semiconductor integrated circuit 1C of FIG. 25, the drain regions D1 and the source regions S1 are alternately formed in the lateral direction of FIG. 25. A plurality of drain electrodes TD1 connected to the drain regions D1 are connected by metal wires W8 and W10 in the vertical direction in FIG. 25. A plurality of source electrodes TS1 formed in the source regions S1 are connected by metal wires W7, W9, and W11 in the vertical direction in FIG. 25. The source regions S1 are the closest to the p-type active regions B formed in the right side and left side of FIG. 25. The source regions S1 which are the closest to the p-type active regions B in the right and left sides of FIG. 25 are each formed in the same region as the drain region D2. Thus, the second NMOS transistor MN2 is formed in the right side and the left side of FIG. 25.

FIG. 26 is a plan view of a semiconductor integrated circuit 1D according to a second applied example. In the semiconductor integrated circuit 1D, the first NMOS transistor MN1 includes the gate electrodes TG1 with a bent shape. The source regions S1 are the closest to the p-type active regions B formed on the right side and left side of FIG. 26. The source regions S1 closest to the p-type active regions B formed in right side and left side of FIG. 26 are each provided in the same region as the drain region D2. Thus, the second NMOS transistors MN2 are formed in the right side and left side of FIG. 26.

FIG. 27 is a plan view of a semiconductor integrated circuit 1E according to a third applied example. In the semiconductor integrated circuit 1E, the first NMOS transistor MN1 includes ring-shaped gate electrodes TG1. The source regions S1 are the closest to the p-type active regions B formed in the right side and left side of FIG. 27. The source regions S1 closest to the p-type active regions B disposed on the right side and left side of FIG. 27 are each provided in the same region as the drain region D2. Thus, the second NMOS transistors MN2 are formed in the right side and left side of FIG. 27.

Preferably, an embodiment of the present invention may be applied to a NMOS transistor having a vertically and laterally intersecting gate structure.

Further, in accordance with an embodiment, when both the drain region D1 and the source region S1 are proximate to the p-type active region B, the second NMOS transistor MN2 may be formed between the source region S1 and the p-type active region B, while the third NMOS transistor MN3 may be formed between the drain region D1 and the p-type active region B. In this way, the effect of reducing the resistance of the substrate current flow path can be obtained both in a normal operation state in which the potential of the source region S1 is lower than the potential of the drain region D1, and a backflow state in which the potential of the source region S1 is higher than the potential of the drain region D1.

Further, in accordance with an embodiment, as in a structure according to the related art, a semiconductor integrated circuit apparatus may be structured by arranging a plurality of the sections enclosed by the p-type active regions B, or the p-type active regions B and an n-type active region adjacent the p-type active region B, namely the source region of the second NMOS transistor MN2 or the drain region of the third NMOS transistor MN3, in the vertical and horizontal directions. Namely, a plurality of the semiconductor integrated circuits 1, 1A, 1B, 1-1, 1A-1, 1B-1, 1-2, 1A-2, 1B-2, 1-3, 1A-3, 1B-3, 1-4, 1A-4, 1B-4, 1-5, 1A-5, 1B-5, 1C, 1D, or 1E may be arranged adjacent to one another to form a semiconductor integrated circuit apparatus.

Figure 28:
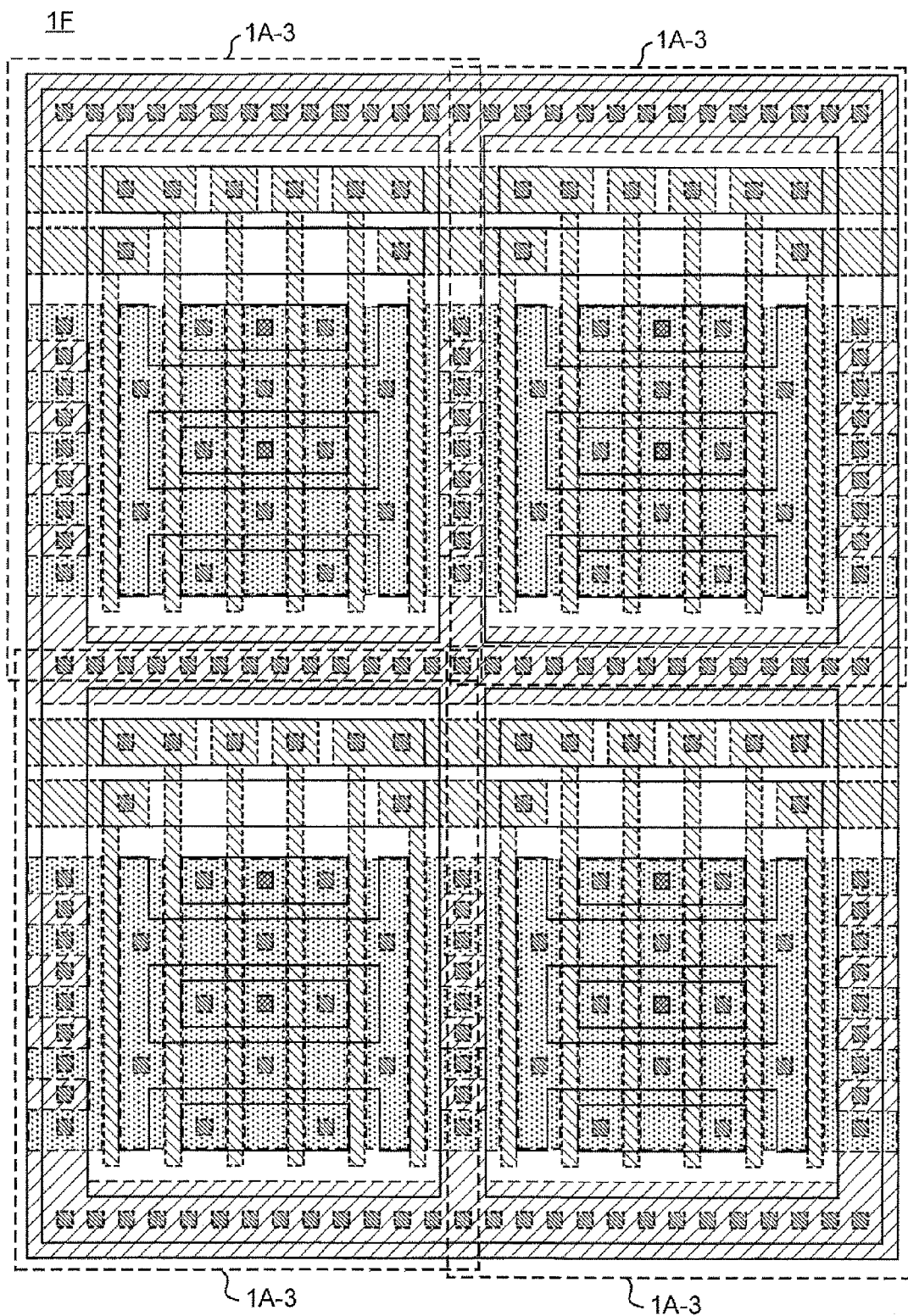
FIG. 28 is a plan view of a semiconductor integrated circuit apparatus according to a fourth applied example.

FIG. 28 is a plan view of a semiconductor integrated circuit apparatus 1F according to a fourth applied example. The semiconductor integrated circuit apparatus 1F is structured by arranging a plurality of the semiconductor integrated circuits 1A-3 of FIG. 13 adjacent to one another in the lateral and vertical directions. In the semiconductor integrated circuit apparatus 1F of FIG. 28, the p-type active regions B and source regions S2 of the laterally adjacent semiconductor integrated circuits 1A-3 are provided in the same region. Further, the p-type active regions B of the vertically adjacent semiconductor integrated circuits 1A-3 are provided in the same region.

In the first through third embodiments, the semiconductor integrated circuits are structured by using NMOS transistors. However, this is merely an example. Preferably, similar semiconductor integrated circuits may be structured by using PMOS transistors.

Thus, in the semiconductor integrated circuit or the semiconductor integrated circuit apparatus according to an embodiment, one or more of the structural elements of the first MOS transistor and one or more of the structural elements of the second MOS transistor are provided by the same structural elements or formed adjacent to one another. Thus, compared with the related art, the occupied area can be reduced. Further, the resistance of the substrate current flow path of the first MOS transistor can be reduced by an appropriate arrangement and wiring of the second MOS transistor. Thus, the increase in substrate potential can be prevented even when there is a substrate current flow. Thus, the operation of the parasitic bipolar transistor of the first MOS transistor can be prevented.

Further, the semiconductor integrated circuit or the semiconductor integrated circuit apparatus according to an embodiment includes the second and third MOS transistors. Thus, compared with the above semiconductor integrated circuit, the resistance of the substrate current flow path of the first MOS transistor can be more effectively reduced. Thus, the increase in substrate potential can be more effectively prevented when there is a substrate current flow. Thus, the effect of preventing the operation of the parasitic bipolar transistor of the first MOS transistor can be improved.

In the embodiment where the semiconductor integrated circuit or the semiconductor integrated circuit apparatus includes the second and third MOS transistors, the following effect can be obtained. Namely, when the potential relationship between a first drain region and a first source region is reversed such that an active region with a first conductivity type needs to be electrically connected to the first drain region or the first source region, the active region can be connected to the first drain region or the first source region via a path having a low resistance by using the second or third MOS transistor.

Although this invention has been described in detail with reference to certain embodiments, variations and modifications exist within the scope and spirit of the invention as described and defined in the following claims.

The present application is based on Japanese Priority Application No. 2010-195889 filed Sep. 1, 2010, the entire contents of which are hereby incorporated by reference.

What is claimed is:

1. A semiconductor integrated circuit comprising:
    a substrate having a first conductivity type;
    a first MOS transistor formed in the substrate; and
    a second MOS transistor formed in the substrate,
    the first MOS transistor including
        a plurality of first drain regions and a plurality of first source regions which are arranged such that each first drain region amongst the plurality of first drain regions of the first MOS transistor is spaced apart from each first source region amongst the plurality of source regions of the first MOS transistor, and are formed in the substrate and having a second conductivity type opposite to the first conductivity type;
        an active region in the substrate having the first conductivity type;
        a plurality of first gate electrodes disposed on the substrate, each first gate electrode amongst the plurality of first gate electrodes of the first MOS transistor being disposed between a corresponding first drain region amongst the plurality of first drain regions and a corresponding first source region amongst the plurality of first source regions;
        a plurality of first drain electrodes, each drain electrode corresponding to a first drain region;
        a plurality of first source electrodes, each source electrode corresponding to a first source region; and
        a first substrate electrode connected to the active region having the first conductivity type,
    the second MOS transistor including
        a second drain region and a second source region which are spaced apart from each other and are formed in the substrate and have the second conductivity type and are disposed between at least one of the plurality of first drain regions of the first MOS transistor and the active region having the first conductivity type, such that said at least one of the plurality of first drain regions of the first MOS transistor is proximate to the second source region,
        wherein, alternatively, the second drain region and the second source region of the second MOS transistor are formed in the substrate and having the second conductivity type between at least one of the plurality of first source regions of the first MOS transistor and the active region having the first conductivity type, such that said at least one of the plurality of first source regions of the first MOS transistor is proximate to the second drain region of the second MOS transistor;
        the active region having the first conductivity type;
        a second gate electrode formed on the substrate between the second drain region and the second source region;
        a second drain electrode connected to the second drain region;
        a second source electrode connected to the second source region; and
        a second substrate electrode connected to the active region having the first conductivity type,
    wherein the first substrate electrode is electrically separate from the plurality of first drain electrodes,
    wherein the second MOS transistor is connected between the first substrate electrode and (i) at least one of the plurality of the plurality of first drain electrodes or (ii) at least one of the plurality of first source electrodes,
    wherein the plurality of first source electrodes and the first substrate electrode are electrically connected to and disconnected from each other, in accordance with a control voltage applied to the second gate electrode of the second MOS transistor, and
    wherein the plurality of first source electrodes are simultaneously connected to the second drain electrode.

2. The semiconductor integrated circuit according to claim 1, wherein the first substrate electrode is electrically connected to the second source electrode, and
    at least one of the plurality of first source electrodes is electrically connected to the second drain electrode.

3. The semiconductor integrated circuit according to claim 1, wherein the second substrate electrode is electrically connected to the second drain electrode or the second source electrode.

4. The semiconductor integrated circuit according to claim 1, wherein the second substrate electrode is formed of the same electrode as the second drain electrode or the second source electrode.

5. The semiconductor integrated circuit according to claim 3, wherein the second drain electrode or the second source electrode that is not connected to the second substrate electrode is electrically connected to at least one of the plurality of first drain electrodes or at least one of the plurality of first source electrodes.

* * * * *